United States Patent
Baker

(10) Patent No.: US 9,336,084 B2
(45) Date of Patent: May 10, 2016

(54) ERROR DETECTION FOR MULTI-BIT MEMORY

(75) Inventor: R. Jacob Baker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 985 days.

(21) Appl. No.: 13/371,133

(22) Filed: Feb. 10, 2012

(65) Prior Publication Data

US 2012/0144269 A1 Jun. 7, 2012

Related U.S. Application Data

(63) Continuation of application No. 11/819,000, filed on Jun. 15, 2007, now Pat. No. 8,117,520.

(51) Int. Cl.
*H03M 13/00* (2006.01)
*G06F 11/10* (2006.01)
*G11C 29/04* (2006.01)

(52) U.S. Cl.
CPC .... *G06F 11/1072* (2013.01); *G11C 2029/0411* (2013.01)

(58) Field of Classification Search
CPC ... H03M 13/09; H03M 13/091; H03M 13/15; H03M 13/1515; H04L 1/0057
USPC ........................................................ 714/781
See application file for complete search history.

(56) References Cited

U.S. PATENT DOCUMENTS

| | | | |
|---|---|---|---|
| 4,460,982 A | 7/1984 | Gee et al. | |
| 5,218,569 A | 6/1993 | Banks | |
| 5,265,104 A * | 11/1993 | Weng | 714/766 |
| 5,600,319 A | 2/1997 | Ginetti | |
| 5,614,856 A | 3/1997 | Wilson et al. | |
| 5,627,784 A | 5/1997 | Roohparvar | |
| 5,719,573 A * | 2/1998 | Leung | H03M 3/448 341/118 |
| 5,748,535 A | 5/1998 | Lin et al. | |
| 5,953,276 A | 9/1999 | Baker | |
| 5,973,956 A | 10/1999 | Blyth et al. | |
| 6,044,019 A | 3/2000 | Cernea et al. | |
| 6,097,637 A | 8/2000 | Bauer et al. | |
| 6,188,340 B1 | 2/2001 | Matsumoto et al. | |
| 6,282,120 B1 | 8/2001 | Cernea et al. | |
| 6,466,476 B1 | 10/2002 | Wong et al. | |
| 6,490,200 B2 | 12/2002 | Cernea et al. | |
| 6,504,750 B1 | 1/2003 | Baker | |
| 6,567,297 B2 | 5/2003 | Baker | |
| 6,661,708 B2 | 12/2003 | Cernea et al. | |
| 6,664,708 B2 | 12/2003 | Shlimak et al. | |
| 6,741,502 B1 | 5/2004 | Cernea | |

(Continued)

OTHER PUBLICATIONS

Rane Corporation, RaneNote 137, "*Digital Charma of Audio A/D Converters*," 1997, 12 pgs.

(Continued)

*Primary Examiner* — Albert Decady
*Assistant Examiner* — Enam Ahmed
(74) *Attorney, Agent, or Firm* — Fletcher Yoder, P.C.

(57) ABSTRACT

Systems, methods, and devices are disclosed, including a device that includes a plurality of data locations, a quantizing circuit coupled to the plurality of data locations, and an error detection module coupled to the quantizing circuit. In some embodiments, the error detection module includes an encoder configured to encode incoming data with redundant data derived from the incoming data and a decoder configured to detect errors in stored data based on the redundant data.

23 Claims, 17 Drawing Sheets

(56) References Cited

U.S. PATENT DOCUMENTS

| | | | |
|---|---|---|---|
| 6,781,906 B2 | 8/2004 | Perner et al. | |
| 6,785,156 B2 | 8/2004 | Baker | |
| 6,795,395 B1 | 9/2004 | Baker | |
| 6,798,705 B2 | 9/2004 | Baker | |
| 6,813,208 B2 | 11/2004 | Baker | |
| 6,822,892 B2 | 11/2004 | Baker | |
| 6,826,102 B2 | 11/2004 | Baker | |
| 6,829,122 B2 | 12/2004 | Baker | |
| 6,847,234 B2 | 1/2005 | Choi | |
| 6,850,441 B2 | 2/2005 | Mokhlesi et al. | |
| 6,856,564 B2 | 2/2005 | Baker | |
| 6,870,784 B2 | 3/2005 | Baker | |
| 6,901,020 B2 | 5/2005 | Baker | |
| 6,914,838 B2 | 7/2005 | Baker | |
| 6,930,942 B2 | 8/2005 | Baker | |
| 6,954,390 B2 | 10/2005 | Baker | |
| 6,954,391 B2 | 10/2005 | Baker | |
| 6,985,375 B2 | 1/2006 | Baker | |
| 7,002,833 B2 | 2/2006 | Hush et al. | |
| 7,009,901 B2 | 3/2006 | Baker | |
| 7,095,667 B2 | 8/2006 | Baker | |
| 7,102,932 B2 | 9/2006 | Baker | |
| 7,133,307 B2 | 11/2006 | Baker | |
| 7,151,701 B2 | 12/2006 | Combe et al. | |
| 7,453,381 B2* | 11/2008 | Doerrer et al. | 341/143 |
| 7,538,702 B2 | 5/2009 | Baker | |
| 7,667,632 B2 | 2/2010 | Baker | |
| 7,768,868 B2 | 8/2010 | Baker | |
| 7,818,073 B2 | 10/2010 | Baker | |
| 8,225,185 B1* | 7/2012 | Tang | H03M 13/153 714/781 |
| 2002/0101758 A1 | 8/2002 | Baker | |
| 2002/0194557 A1 | 12/2002 | Park | |
| 2003/0039162 A1 | 2/2003 | Baker | |
| 2003/0043616 A1 | 3/2003 | Baker | |
| 2003/0067797 A1 | 4/2003 | Baker | |
| 2003/0198078 A1 | 10/2003 | Baker | |
| 2003/0214868 A1 | 11/2003 | Baker | |
| 2004/0008555 A1 | 1/2004 | Baker | |
| 2004/0032760 A1 | 2/2004 | Baker | |
| 2004/0062100 A1 | 4/2004 | Baker | |
| 2004/0076052 A1 | 4/2004 | Baker | |
| 2004/0095839 A1 | 5/2004 | Baker | |
| 2004/0190327 A1 | 9/2004 | Baker | |
| 2004/0190334 A1 | 9/2004 | Baker | |
| 2004/0199710 A1 | 10/2004 | Baker | |
| 2004/0240294 A1 | 12/2004 | Baker | |
| 2005/0002249 A1 | 1/2005 | Baker | |
| 2005/0007803 A1 | 1/2005 | Baker | |
| 2005/0007850 A1 | 1/2005 | Baker | |
| 2005/0013184 A1 | 1/2005 | Baker | |
| 2005/0018477 A1 | 1/2005 | Baker | |
| 2005/0018512 A1 | 1/2005 | Baker | |
| 2005/0041128 A1 | 2/2005 | Baker | |
| 2005/0088892 A1 | 4/2005 | Baker | |
| 2005/0088893 A1 | 4/2005 | Baker | |
| 2005/0201145 A1 | 9/2005 | Baker | |
| 2006/0013040 A1 | 1/2006 | Baker | |
| 2006/0062062 A1 | 3/2006 | Baker | |
| 2006/0227641 A1 | 10/2006 | Baker | |
| 2006/0250853 A1 | 11/2006 | Taylor et al. | |
| 2007/0171714 A1* | 7/2007 | Wu et al. | 365/185.09 |
| 2007/0171730 A1* | 7/2007 | Ramamoorthy et al. | 365/185.33 |
| 2008/0310236 A1 | 12/2008 | Baker | |

OTHER PUBLICATIONS

Baker, R.J., (2001-2006) *Sensing Circuits for Resistive Memory*, presented at various universities and companies.

Baker, "*CMOS Mixed Signal Circuit Design*," IEEE Press, A. John Wiley & Sons, Inc.; Copyright 2003, Figures 30.63, 31.82, 32.6, 32.7, 32.24, 32.51, 33.34, 33.47, 33.51, 34.18, 34.24; located at http://cmosedu.com/cmos2/book2.htm.

Dallas Semiconductor, Maxim Application Note 1870, "*Demystifying Sigma-Delta ADCs*," (Jan. 31, 2003), 15 pgs.

Baker, R.J., (2003) *Mixed-Signal Design in the Microelectronics Curriculum*, IEEE University/Government/Industry Microelectronics (UGIM) Symposium, Jun. 30-Jul. 2, 2013.

Baker, R.J. (2004) Delta-Sigma Modulation for Sensing, *IEEE/EDS Workshop on Microelectronics and Electron Devices (WMED)*, Apr. 2004.

Baker, "*CMOS Circuit Design, Layout and Simulation*," Second Edition, IEEE Press, A. John Wiley & Sons, Inc.; Copyright 2005; Chapters 13, 16, 17, 20, 22-24, 28-29; pp. 375-396, 433-522, 613-656, 711-828, 931-1022.

Hadrick, M. and Baker, R.J., (2005) *Sensing in CMOS Imagers using Delta-Sigma Modulation*, a general presentation of our work in this area.

Baker, R.J. (2005) Design of High-Speed CMOS Op-Amps for Signal Processing, *IEEE/EDS Workshop on Microelectronics and Electron Devices (WMED)*, Apr. 2005.

Leslie, M.B., and Baker, R.J., (2006) "Noise-Shaping Sense Amplifier for MRAM Cross-Point Arrays" *IEEE Journal of Solid State Circuits*, vol. 41, No. 3, pp. 699-704.

Duvvada, K., Saxena, V., and Baker, R. J., (2006) *High Speed Digital Input Buffer Circuits*, proceedings of the IEEE/EDS Workshop on Microelectronics and Electron Devices (WMED), pp. 11-12, Apr. 2006.

Saxena, V., Plum, T.J., Jessing, J.R., and Baker, R. J., (2006) *Design and Fabrication of a MEMS Capacitive Chemical Sensor System*, proceedings of the IEEE/EDS Workshop on Microelectronics and Electron Devices (WMED), pp. 17-18, Apr. 2006.

Baker, R.J. and Saxena, V., (2007) *Design of Bandpass Delta Sigma Modulators: Avoiding Common Mistakes*, presented at various universities and companies.

Wikipedia—definition of "Error detection and correction", pulled from website Jun. 1, 2007, 9 pgs.

Wikipedia—definition of "Hamming code", pulled from website Jun. 1, 2007, 8 pgs.

Wikipedia—definition of "Linear feedback shift register (LFSR)," pulled from website Jun. 1, 2007, 4 pgs.

Park, "Motorola Digital Signal Processors—Principles of Sigma-Delta Modulation for Analog-to-Digital Converters," 1996, pp. 1-64.

* cited by examiner

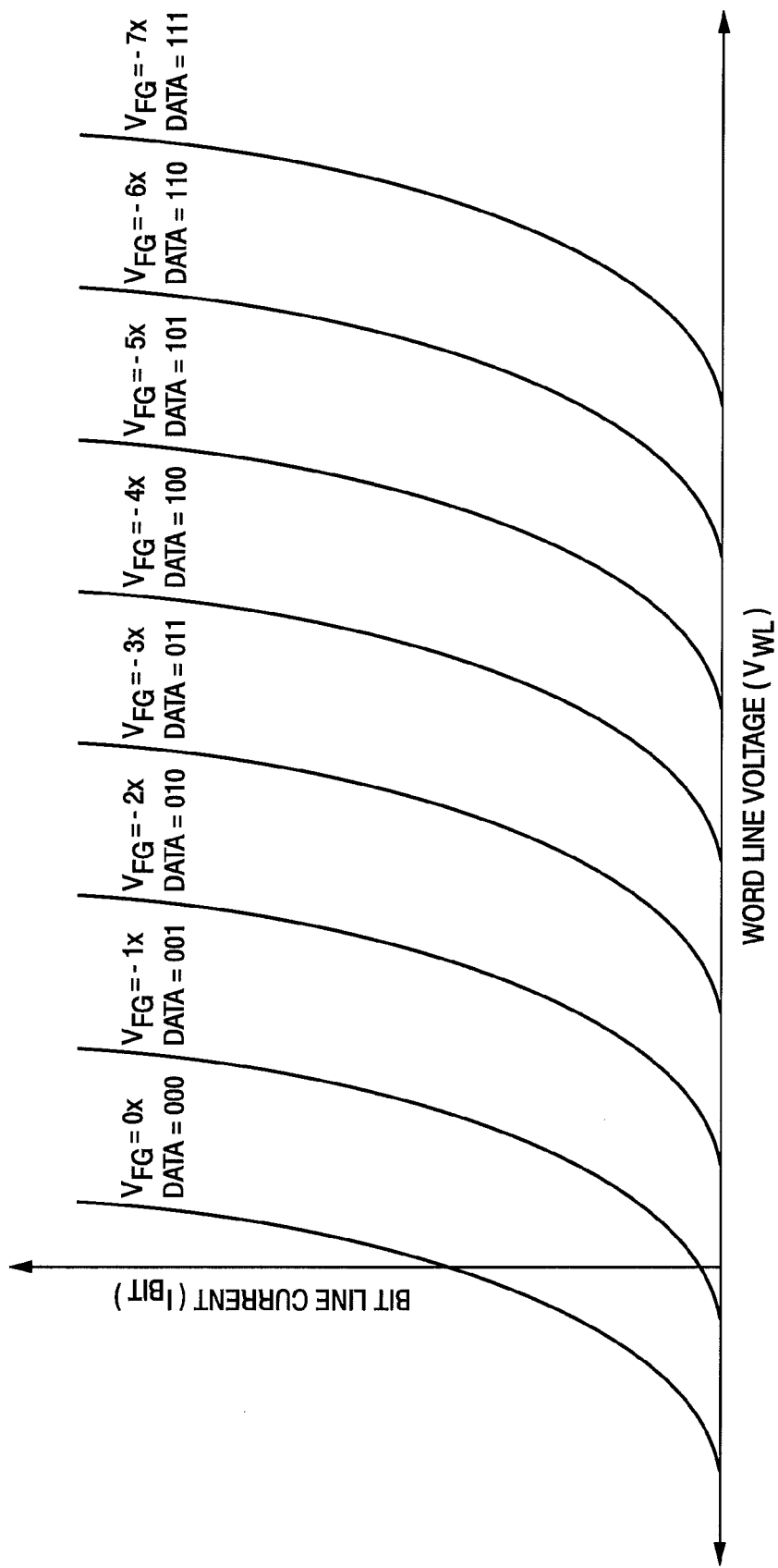

ERROR DETECTION FOR MULTI-BIT MEMORY

CROSS-REFERENCE TO RELATED APPLICATION

This application is a continuation of U.S. patent application Ser. No. 11/819,000, which was filed on Jun. 15, 2007, now U.S. Pat. No. 8,117,520, which issued on Feb. 14, 2012.

BACKGROUND

1. Field of Invention

Embodiments of the present invention relate generally to error detection and, more specifically, in one embodiment, to error detection for a multi-bit memory.

2. Description of Related Art

Generally, memory devices include an array of memory elements and associated sense amplifiers. The memory elements store data, and the sense amplifiers read the data from the memory elements. To read data, for example, a current is passed through the memory element, and the current or a resulting voltage is measured by the sense amplifier. Conventionally, the sense amplifier measures the current or voltage by comparing it to a reference current or voltage. Depending on whether the current or voltage is greater than the reference, the sense amplifier outputs a value of one or zero. That is, the sense amplifier quantizes (e.g., digitizes) the analog signal from the memory element into one of two logic states.

Many types of memory elements are capable of assuming more than just two states. For example, some memory elements are capable of muti-bit (e.g., more than two state) storage. For instance, rather than outputting either a high or low voltage, the memory element may output four or eight different voltage levels, each level corresponding to a different data value. However, conventional sense amplifiers often fail to distinguish accurately between the additional levels because the difference between the levels (e.g., a voltage difference) in a multi-bit memory element is often smaller than the difference between the levels in a single-bit (i.e., two state) memory element. Thus, conventional sense amplifiers often cannot read multi-bit memory elements. This problem may be increased as high performance multi-bit memory elements become increasingly dense, thereby reducing the size of the memory elements and the difference between the levels (e.g., voltage) to be sensed by the sense amplifiers.

A variety of factors may tend to prevent the sense amplifier from discerning small differences in the levels of a multi-bit memory element. For instance, noise in the power supply, ground, and reference voltage may cause an inaccurate reading of the memory element. The noise may have a variety of sources, such as temperature variations, parasitic signals, data dependent effects, and manufacturing process variations. This susceptibility to noise often leads a designer to reduce the number of readable states of the memory element, which tends to reduce memory density and increase the cost of memory.

Conventional sense amplifiers present similar problems in imaging devices. In these devices, an array of light sensors output a current or voltage in response to light impinging upon the sensor. The magnitude of the current or voltage typically depends upon the intensity of the light. Thus, the capacity of the sense amplifier to accurately convert the current or voltage into a digital signal may determine, in part, the fidelity of the captured image. Consequently, noise affecting the sense amplifier may diminish the performance of imaging devices.

BRIEF DESCRIPTION OF DRAWINGS

FIG. 5 illustrates I-V traces of memory elements storing different values, in accordance with an embodiment of the present invention;

DETAILED DESCRIPTION OF SPECIFIC EMBODIMENTS

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently described embodiments may address one or more of the problems with conventional sense amplifiers discussed above. Some embodiments include a quantizing circuit configured to detect small differences in voltages and/or currents. As explained below, the quantizing circuit may sample the measured electrical parameter on multiple occasions and filter, e.g., average or sum, the samples to reduce the impact of noise. As a result, in some embodiments, the quantizing circuit may resolve small differences between voltage or current levels in multi-bit memory elements and/or light sensors, which may allow circuit designers to increase the number of bits stored per memory element and/or the sensitivity of an imaging device.

Figure 16:
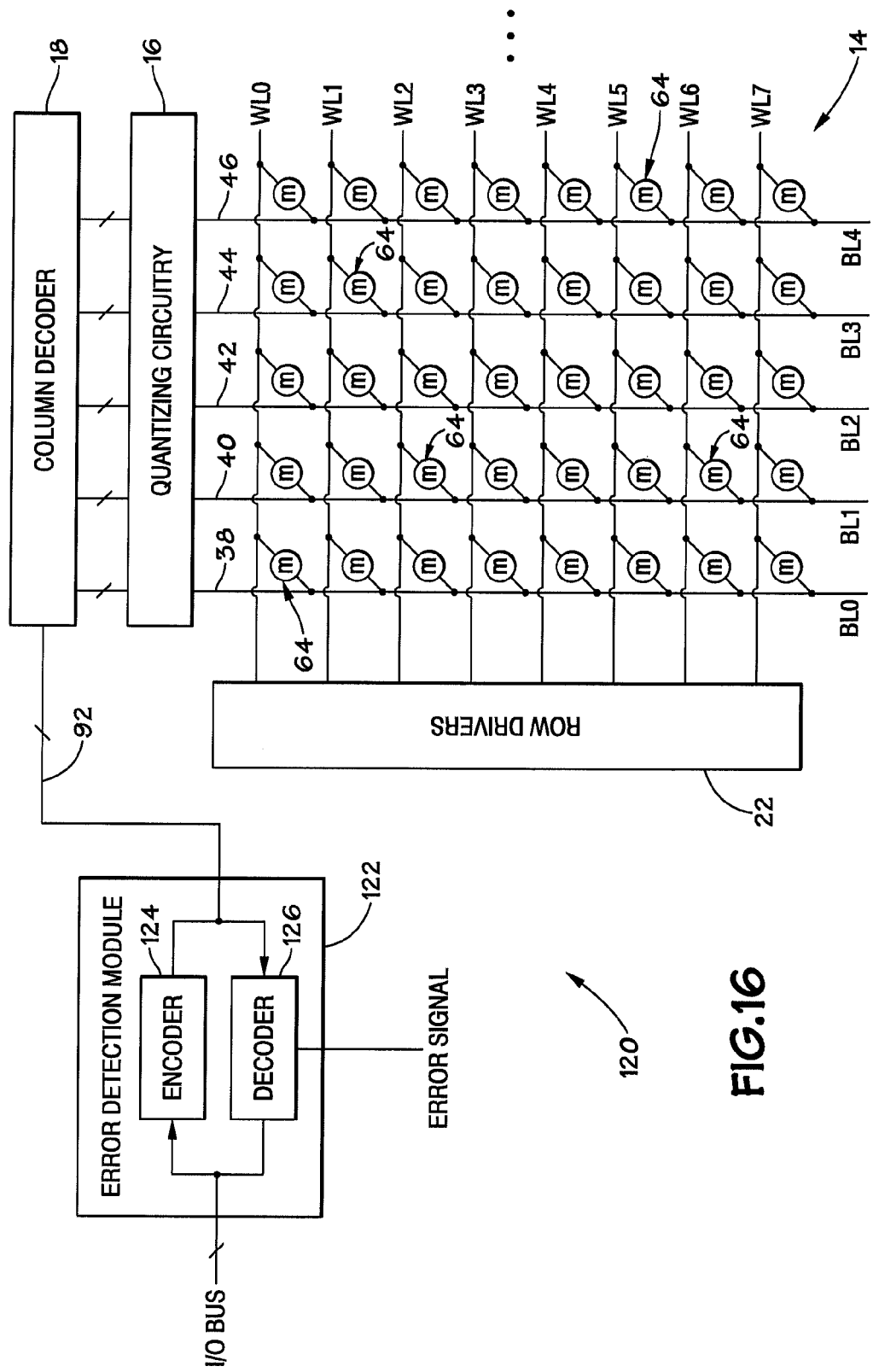
FIG. 16 illustrates an example of an error detection module in accordance with an embodiment of the present invention.
Figure 17:
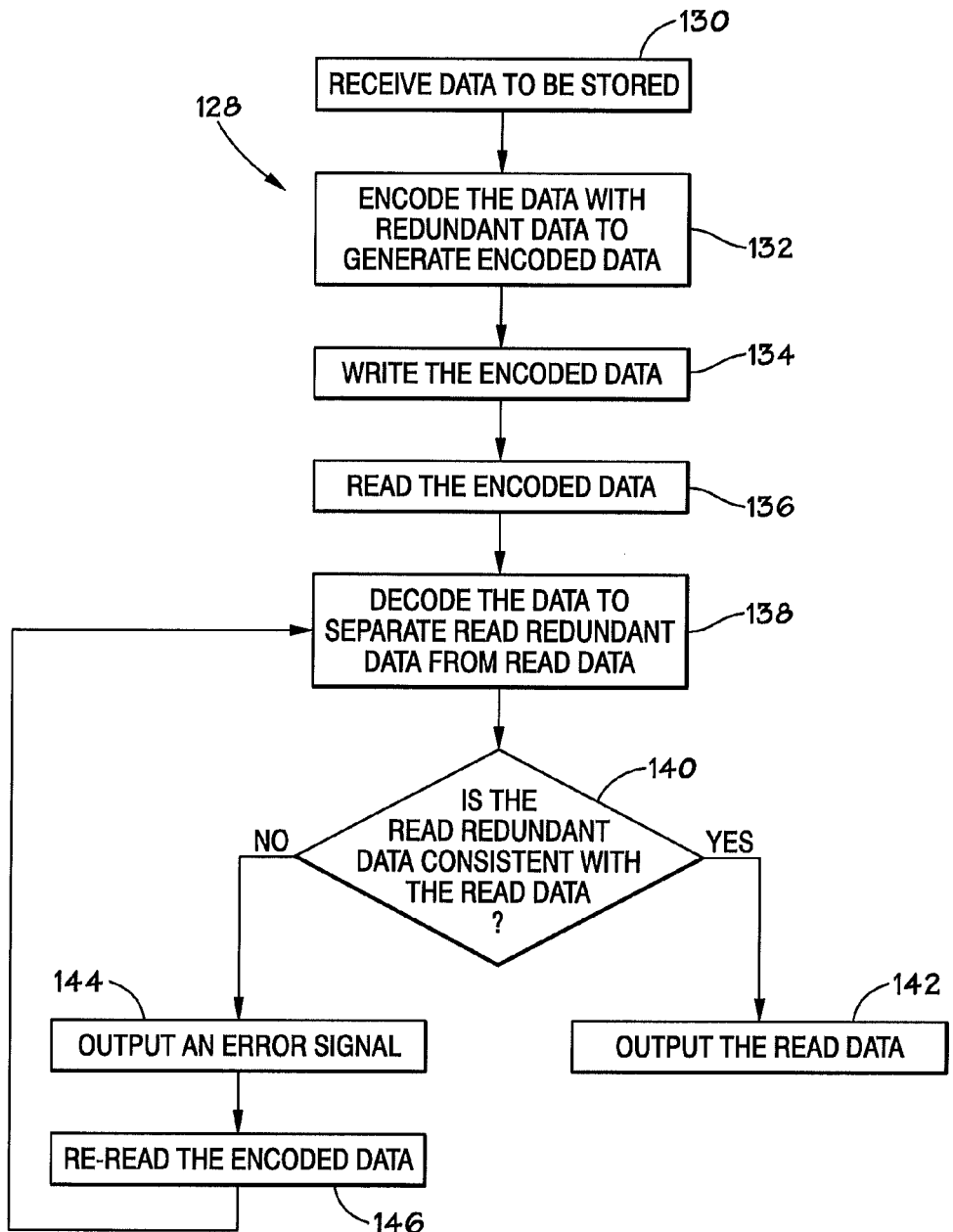
FIG. 17 is a flowchart illustrating the operation of the error detection module of FIG. 16.
Figure 18:
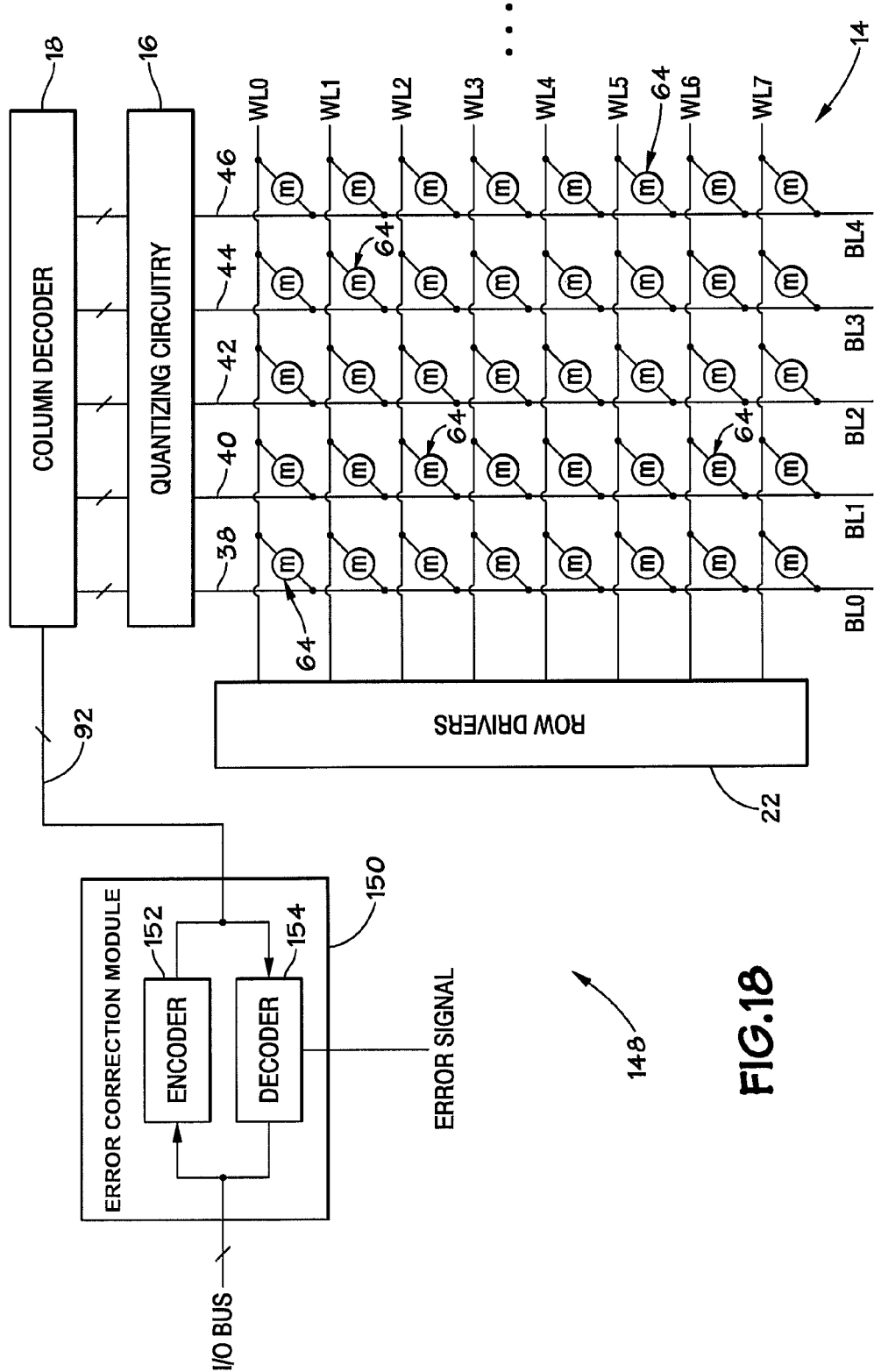
FIG. 18 illustrates an example of an error correction module in accordance with an embodiment of the present invention.
Figure 19:
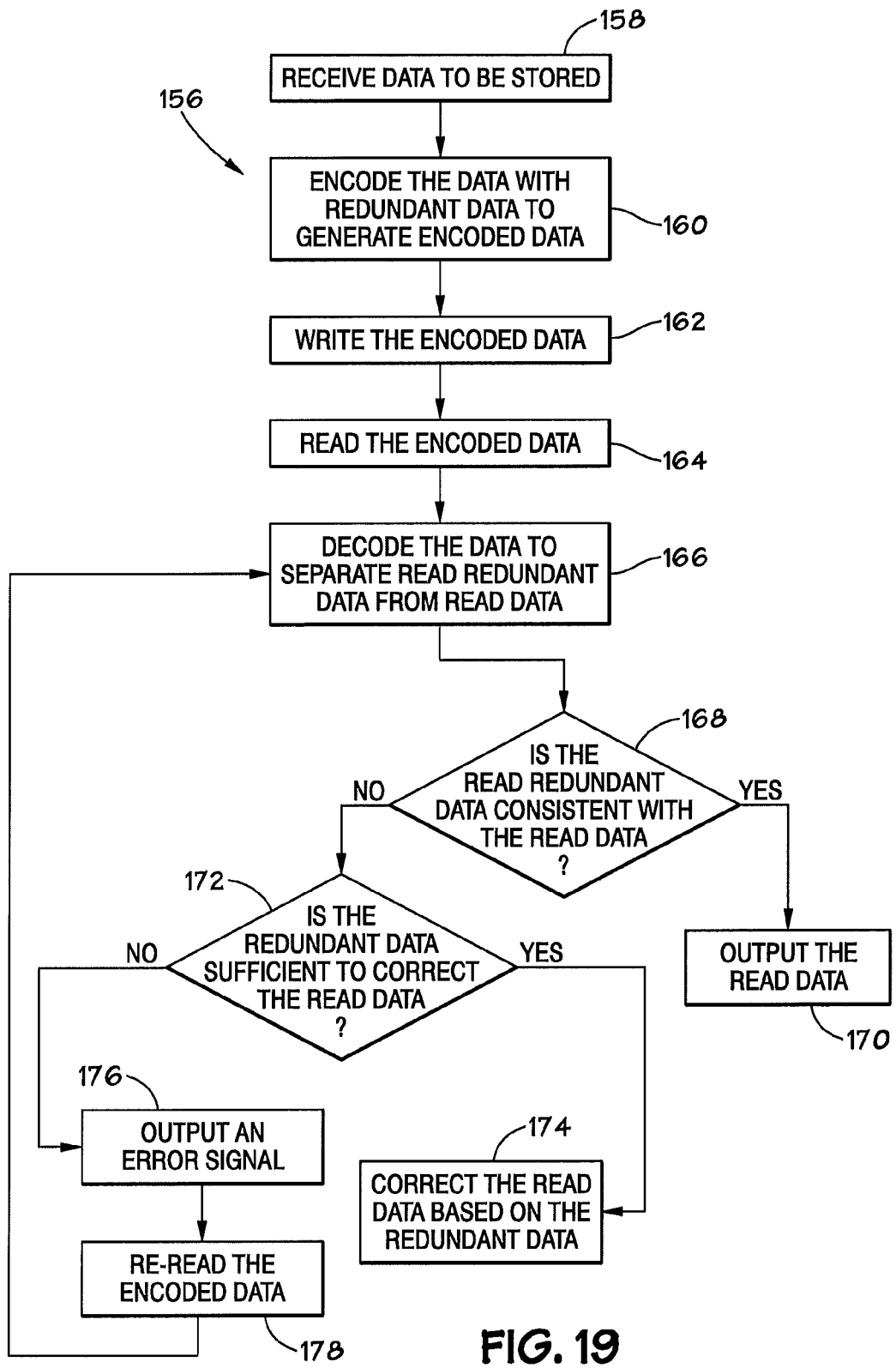
FIG. 19 is a flowchart illustrating the operation of the error correction module of FIG. 18.

Some of the embodiments described herein are configured to detect errors that may arise when writing to or reading from a memory element. Specifically, the FIG. 16 illustrates a memory device with an error detection module that, as explained below, encodes stored data with redundant data before writing and, after reading, uses the redundant data to detect errors in the stored data. The FIG. 17 illustrates an error detection process that may be performed by the memory device of FIG. 16. FIGS. 18-19 illustrate an error correction module that may both detect errors and with the aforementioned redundant data. Advantageously, these embodiments may reduce the likelihood of corrupted data leaving a memory device. Prior to describing these embodiments and their advantages, the environment in which they operate is described.

Figure 1:
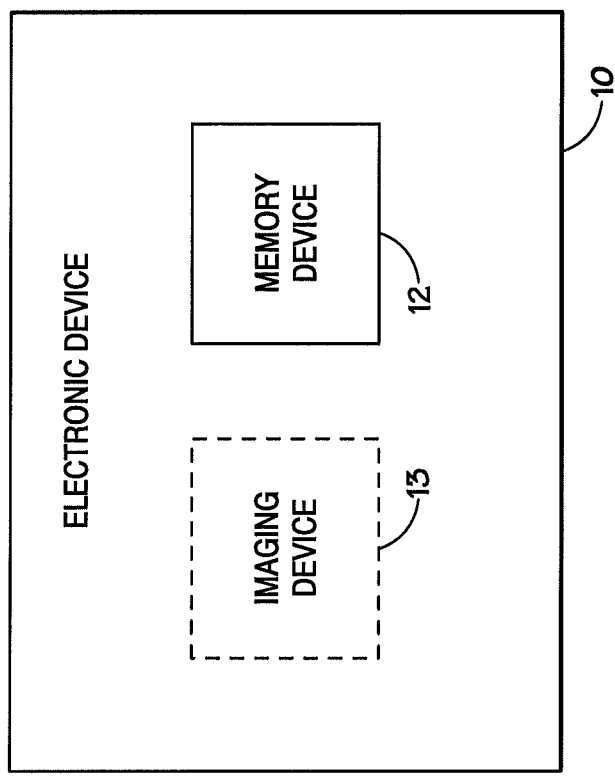
FIG. 1 illustrates an electronic device in accordance with an embodiment of the present invention.

FIG. 1 depicts an electronic device 10 that may be fabricated and configured in accordance with one or more of the present embodiments. The illustrated electronic device 10 includes a memory device 12 that, as explained further below, may include multi-bit memory elements and quantizing circuits. Alternatively, or additionally, the electronic device 10 may include an imaging device 13 having the quantizing circuits.

Myriad devices may embody one or more of the present techniques. For example, the electronic device 10 may be a storage device, a communications device, an entertainment device, an imaging system, or a computer system, such as a personal computer, a server, a mainframe, a tablet computer, a palm-top computer, or a laptop.

Figure 2:
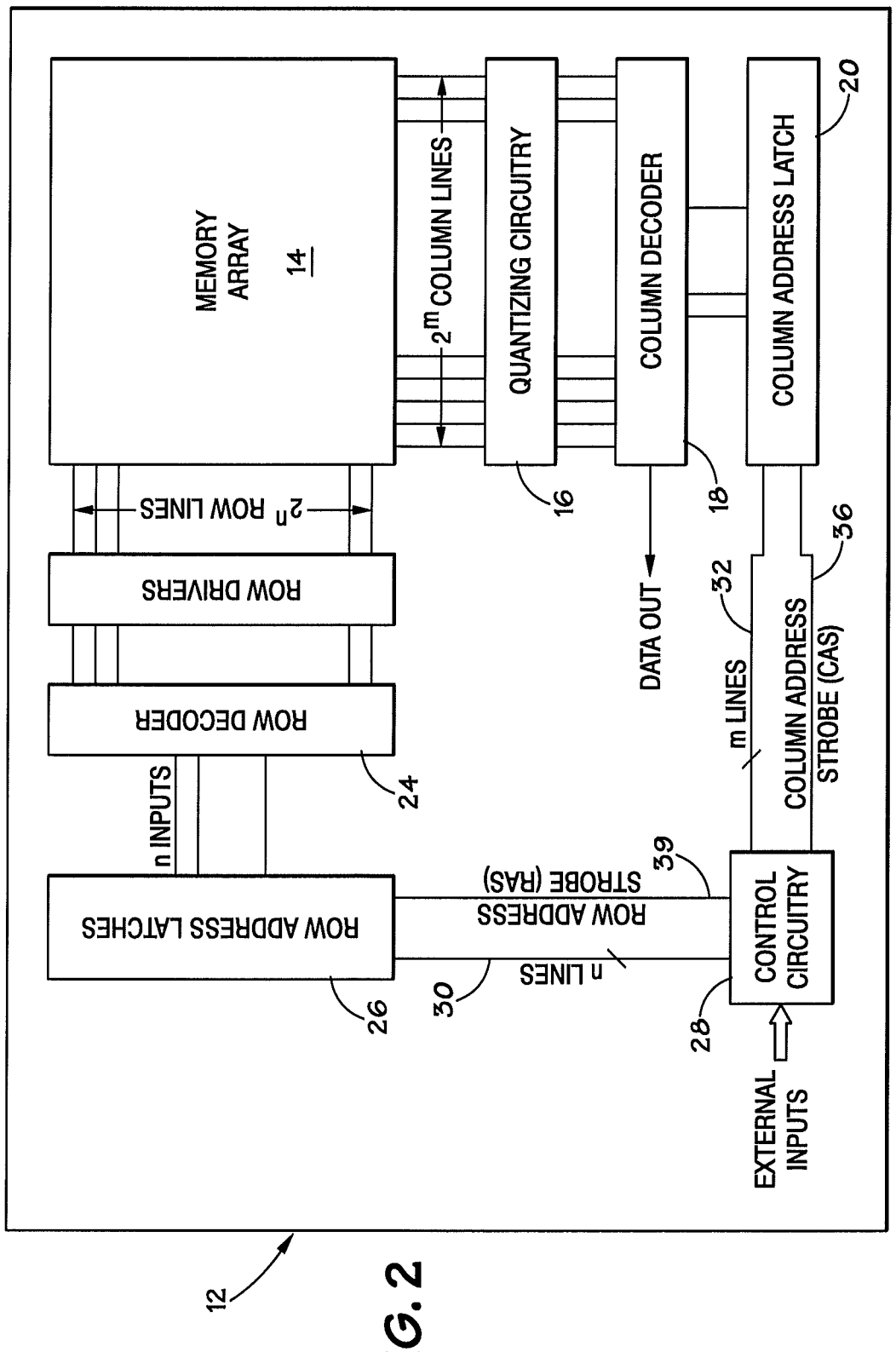
FIG. 2 illustrates a memory device in accordance with an embodiment of the present invention.

FIG. 2 depicts a block diagram of an embodiment of the memory device 12. The illustrated memory device 12 may include a memory array 14, a quantizing circuit 16, a column decoder 18, a column address latch 20, row drivers 22, a row decoder 24, row address latches 26, and control circuitry 28. As described below with reference to FIG. 3, the memory array 14 may include a matrix of memory elements arranged in rows and columns. As will be appreciated, the imaging device 13 (FIG. 1) may include similar features except that in the case of an imaging device 13, the array 14 might comprise an array of imaging elements, such as complementary-metal-oxide semiconductor (CMOS) imaging elements or charge coupled devices (CCDs).

When accessing the memory elements, the control circuitry may receive a command to read from or write to a target memory address. The control circuitry 28 may then convert the target address into a row address and a column address. In the illustrated embodiment, the row address bus 30 transmits the row address to the row address latches 26, and a column address bus 32 transmits column address to the column address latches 20. After an appropriate settling time, a row address strobe (RAS) signal 34 (or other controlling clock signal) may be asserted by the control circuitry 28, and the row address latches 26 may latch the transmitted row address. Similarly, the control circuitry 28 may assert a column address strobe 36, and the column address latches 20 may latch the transmitted column address.

Once row and column addresses are latched, the row decoder 24 may determine which row of the memory array 14 corresponds to the latched row address, and the row drivers 22 may assert a signal on the selected row. Similarly, the column decoder 18 may determine which column of the memory array 14 corresponds with the latched column address, and the quantizing circuit 16 may quantize (e.g., sense) a voltage or current on the selected column. Additional details of reading and writing are described below.

Figure 3:
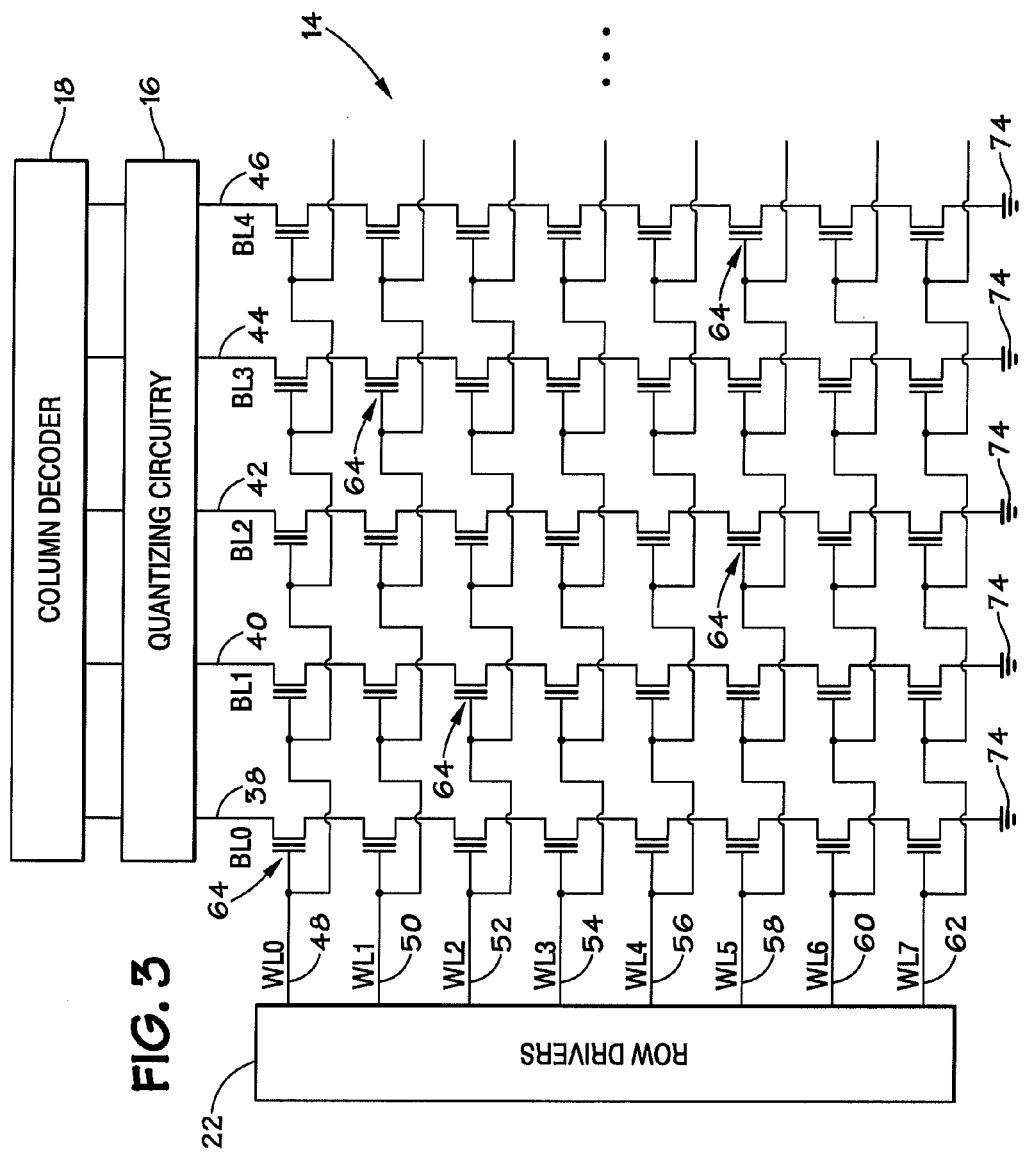
FIG. 3 illustrates a memory array in accordance with an embodiment of the present invention.

FIG. 3 illustrates an example of a memory array 14. The illustrated memory array 14 includes a plurality of bit-lines 38, 40, 42, 44, and 46 (also referred to as BL0-BL4) and a plurality of word-lines 48, 50, 52, 54, 56, 58, 60, and 62 (also referred to as WL0-WL7). These bit-lines and word-lines are examples of electrical conductors. The memory array 14 further includes a plurality of memory elements 64, each of which may be arranged to intersect one of the bit-lines and one of the word-lines. In other embodiments, imaging elements may be disposed at each of these intersections.

The memory elements and imaging elements may be referred to generally as data locations, i.e., devices or elements configured to convey data, either stored or generated by a sensor, when sensed by a sensing circuit, such as the quantizing circuits discussed below. The data locations may be formed on an integrated semiconductor device (e.g., a device formed on a single crystal of silicon) that also includes the other components of the memory device 12 (or imaging device 13).

In some embodiments, the illustrated memory elements 64 are flash memory devices. The operation of the flash memory elements is described further below with reference to the FIGS. 4 and 5. It should be noted that, in other embodiments, the memory elements 64 may include other types of volatile or nonvolatile memory. For example, the memory elements 64 may include a resistive memory, such as a phase change memory or magnetoresistive memory. In another example, the memory elements 64 may include a capacitor, such as a stacked or trench capacitor. Some types of memory elements 64 may include an access device, such as a transistor or a diode associated with each of the memory elements 64, or the memory elements 64 may not include an access device, for instance in a cross-point array.

Figure 4:
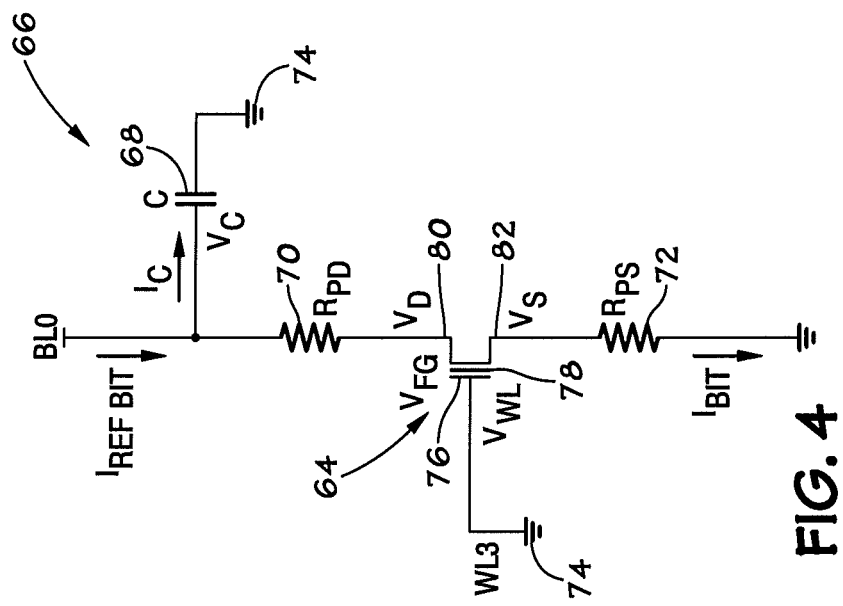
FIG. 4 illustrates a memory element in accordance with an embodiment of the present invention.

FIG. 4 illustrates a circuit 66 that models the operation of an arbitrarily selected memory element 64, which is disposed at the intersection of WL3 and BL0. This circuit 66 includes a capacitor 68, a pre-drain resistor 70 ($R_{PD}$), a post-source resistor 72 ($R_{PS}$), and a ground 74. The resistors 70 and 72 model the other devices in series with the memory element 64 being sensed. The illustrated memory element 64 includes a gate 76, a floating gate 78, a drain 80, and a source 82. In the circuit 66, the drain 80 and source 82 are disposed in series between the pre-drain resistor 70 and the post-source resistor 72. The gate 76 is connected to WL3. The pre-drain resistor 70, the drain 80, the source 82, and the post-source resistor 72 are disposed in series on the bit-line BL0. The capacitor 68, which models the capacitance of the bit-line, has one plate connected to ground 74 and another plate connected to the bit-line BL0, in parallel with the memory elements 64.

Several of the components of the circuit 66 represent phenomenon affecting the memory elements 64 when it is sensed. The pre-drain resistor 70 generally represents the drain-to-bitline resistance of the memory elements 64 connected to the bit-line above (i.e., up current from) WL3 when these memory elements 64 are turned on, (e.g., during a read operation). Similarly, the post source resistor 72 generally corresponds to the source-to-ground resistance of the memory elements 64 connected to the bit-line below WL3 when the memory element 64 is sensed. The circuit 66 models electrical phenomena associated with reading the memory elements 64 at the intersection of WL3 and BL0.

The operation of the memory elements 64 will now be briefly described with reference to FIGS. 4 and 5. FIG. 5 illustrates one potential relationship between the bit-line current ($I_{BIT}$), the word-line voltage ($V_{WL}$), and the voltage of the floating gate 78 ($V_{FG}$). As illustrated by FIG. 5, $V_{FG}$ affects the response of the memory element 64 to a given $V_{WL}$. Decreasing the voltage of the floating gate shifts the I-V curve of the memory elements 64 to the right. That is, the relationship between the bit-line current and a word-line voltage depends on the voltage of the floating gate 78. The memory elements 64 may store data by exploiting this effect.

To write data to the memory elements 64, a charge corresponding to the data may be stored on the floating gate 78. The charge of the floating gate 78 may be modified by applying voltages to the source 82, drain 80, and/or gate 76 such that the resulting electric fields produce phenomenon like Fowler-Northam tunneling and/or hot-electron injection near the floating gate 78. Initially, the memory elements 64 may be erased by applying a word-line voltage designed to drive electrons off of the floating gate 78. In some embodiments, an entire column or block of memory elements 64 may be erased generally simultaneously. Once the memory elements 64 are erased, the gate 76 voltage may be manipulated to drive a charge onto the floating gate 78 that is indicative of a data value. After the write operation ends, the stored charge may remain on the floating gate 78 (i.e., the memory elements 64 may store data in a nonvolatile fashion).

As illustrated by FIG. 5, the value stored by the memory element 64 may be read by applying a voltage, $V_{WL}$, to the gate 76 and quantizing (e.g., categorizing) a resulting bit-line current, $I_{BIT}$. Each of the I-V traces depicted by FIG. 5 correspond to a different charge stored on the floating gate, $V_{FG}$, which should not be confused with the voltage that is applied to the gate, $V_{WL}$. The difference in floating gate 70 voltage, $V_{FG}$, between each I-V trace is an arbitrarily selected scaling factor "x." The illustrated I-V traces correspond to eight-different data values stored by the memory element 64, with a $V_{FG}$ of 0x representing a binary data value of 000, a $V_{FG}$ of 1x representing a binary data value of 001, and so on through $V_{FG}$ of 7x, which represents a binary data value of 111. Thus, by applying a voltage to the gate 76 and measuring the resulting bit-line current, the charge stored on the floating gate 78 may be sensed, and the stored data may be read.

The accuracy with which the bit-line current is quantized may affect the amount of data that a designer attempts to store in each memory element 64. For example, in a system with a low sensitivity, a single bit may be stored on each memory element 64. In such a system, a floating gate voltage $V_{FG}$ of 0x may represent a binary value of 0, and a floating gate voltage $V_{FG}$ of −7x may represent a binary value of one. Thus, the difference in floating gate voltages $V_{FG}$ corresponding to different data values may be relatively large, and the resulting differences and bit-line currents for different data values may also be relatively large. As a result, even low-sensitivity sensing circuitry may quantize (e.g., discern) these large differences in bit-line current during a read operation. In contrast, high-sensitivity sensing circuitry may facilitate storing more data in each memory element 64. For instance, if the sensing circuitry can distinguish between the eight different I-V traces depicted by FIG. 5, then the memory elements 64 may store three bits. That is, each of the eight different charges stored on the floating gate 78 may represent a different three-bit value: 000, 001, 010, 011, 100, 101, 110, or 111. Thus, circuitry that precisely quantizes the bit-line current $I_{BIT}$ may allow a designer to increase the amount of data stored in each memory element 64.

Figure 6:
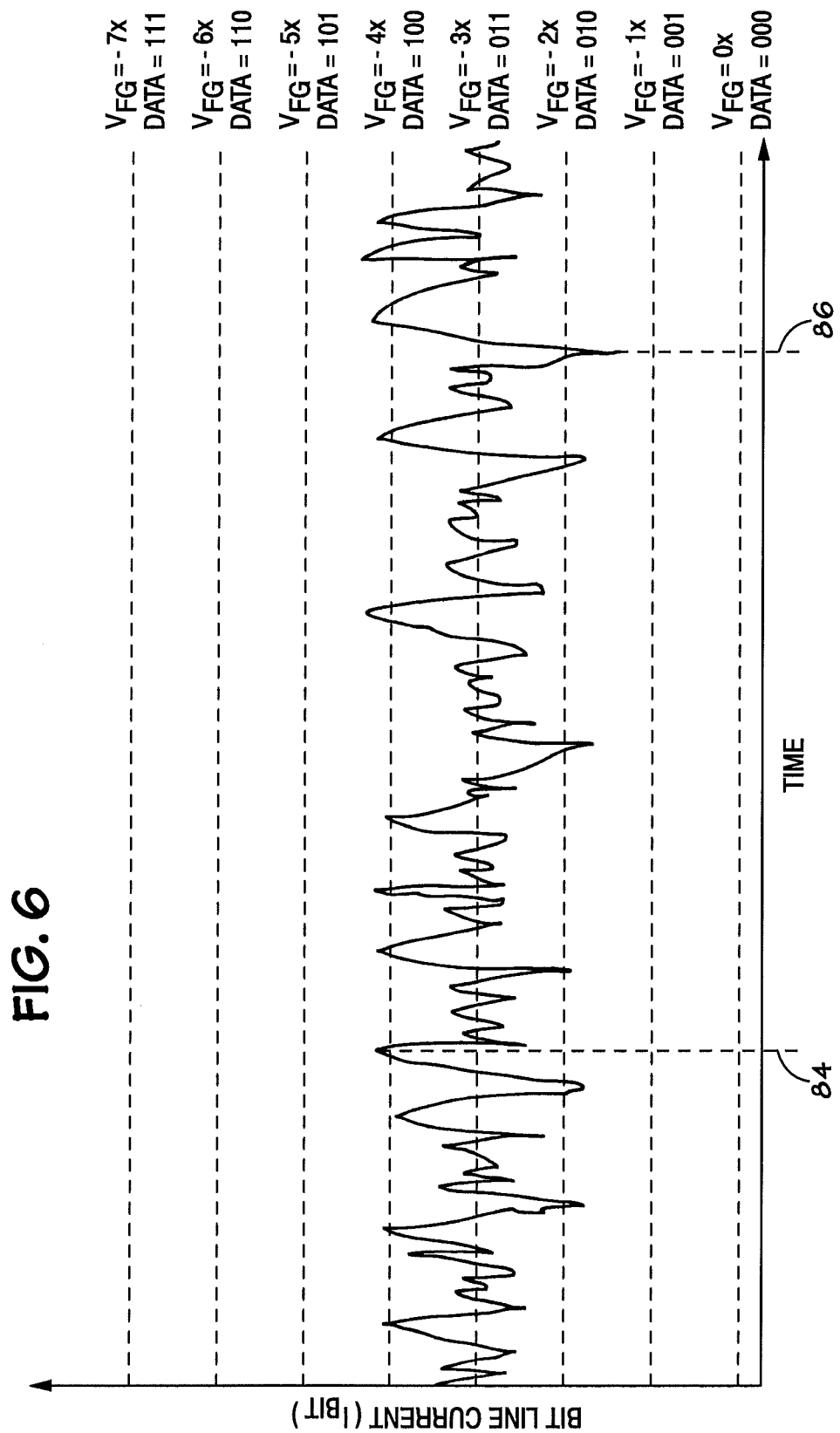
FIG. 6 illustrates noise in the bit-line current during a read operation.

However, as mentioned above, a variety of effects may interfere with accurate measurement of the bit-line current. For instance, the position of the memory elements 64 along a bit-line may affect $R_{PD}$ and $R_{PS}$, which may affect the relationship between the word-line voltage $V_{WL}$ and the bit-line current $I_{BIT}$. To illustrate these effects, FIG. 6 depicts noise on the bit-line while reading from the memory element 64. As illustrated, noise in the bit-line current $I_{BIT}$ may cause the bit-line current $I_{BIT}$ to fluctuate. Occasionally, the fluctuation may be large enough to cause the bit-line current $I_{BIT}$ to reach a level that represents a different stored data value, which could cause the wrong value to be read from the memory elements 64. For instance, if the bit-line current is sensed at time 84, corresponding to an arbitrarily selected peak, a data value of 100 may be read rather than the correct data value of 011. Similarly, if the bit-line current is sensed at time 86, corresponding to an arbitrarily selected local minimum, a data value of 010 may be read rather than a data value of 011. Thus, noise on the bit-line may cause erroneous readings from memory elements 64.

Figure 7:
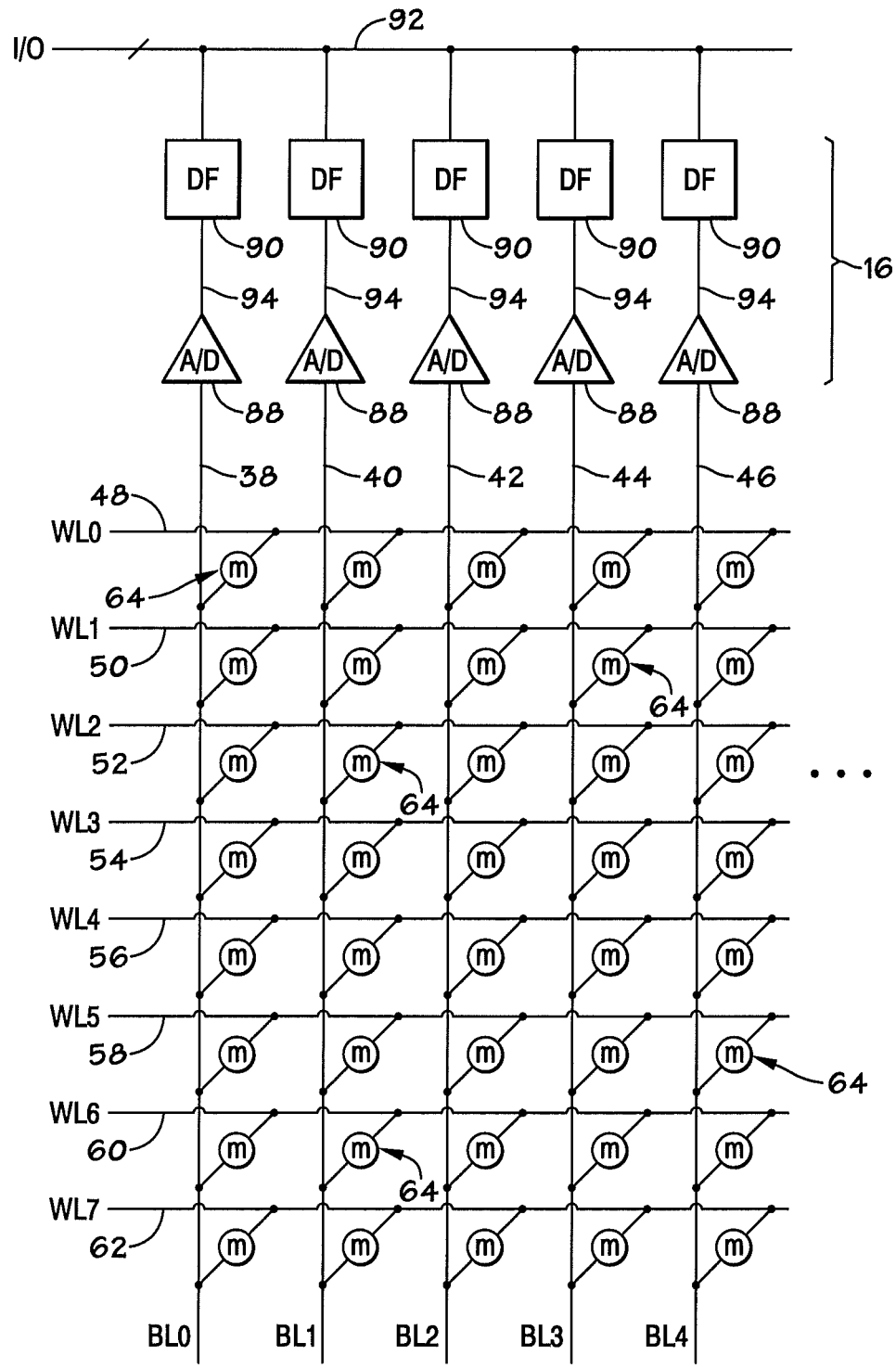
FIG. 7 illustrates a quantizing circuit in accordance with an embodiment of the present invention.

FIG. 7 depicts a quantizing circuit 16 that may tend to reduce the likelihood of an erroneous reading. The illustrated quantizing circuit 16 includes an analog-to-digital converter 88 and a digital filter 90 connected to each of the bit-lines 38, 40, 42, 44, and 46, respectively. Each bit-line 38, 40, 42, 44, and 46 may connect to a different analog-to-digital converter 88 and digital filter 90. The digital filters 90, in turn, may connect to an input/output bus 92, which may connect to a column decoder 18, a column address latch 20, and/or control circuitry 28 (see FIG. 2).

In operation, the quantizing circuit 16 may quantize (e.g., digitize) analog signals from the memory elements 64 in a manner that is relatively robust to noise. As explained below, the quantizing circuit 16 may do this by converting the analog signals into a bit-stream and digitally filtering high-frequency components from the bit-stream.

The analog-to-digital converter 88 may be a one-bit, analog-to-digital converter or a multi-bit, analog-to-digital converter. In the present embodiment, an analog-to-digital converter 88 receives an analog signal from the memory element 64, e.g., a bit-line current $I_{BIT}$ or a bit-line voltage $V_{BL}$, and outputs a bit-stream that represents the analog signal. The bit-stream may be a one-bit, serial signal with a time-averaged value that generally represents the time-averaged value of the analog signal from the memory element 64. That is, the bit-stream may fluctuate between values of zero and one, but its average value, over a sufficiently large period of time, may be proportional to the average value of the analog signal from the memory element 64. In certain embodiments, the bit-stream from the analog-to-digital converter 88 may be a pulse-density modulated (PDM) version of the analog signal. The analog-to-digital converter 88 may transmit the bit-stream to the digital filter 90 on a bit-stream signal path 94.

The digital filter 90 may digitally filter high-frequency noise from the bit-stream. To this end, the digital filter 90 may be a low-pass filter, such as a counter, configured to average (e.g., integrate and divide by the sensing time) the bit-stream over a sensing time, i.e., the time period over which the memory element 64 is read. (Alternatively, in some embodiments, the digital filter 90 is configured to integrate the bit-stream without dividing by the sensing time.) As a result, the digital filter 90 may output a value that is representative of both the average value of the bit-stream and the average value of the analog signal from the memory element 64. In some embodiments, the digital filter 90 is a counter, and the cut-off frequency of the digital filter 90 may be selected by adjusting the duration of the sensing time. In the present embodiment, increasing the sensing time will lower the cutoff frequency. That is, the frequency response of the digital filter 90 may be modified by adjusting the period of time over which the bit-stream is integrated and/or averaged before outputting a final value. The frequency response of the digital filter 90 is described further below with reference to FIG. 15. For multi-bit memory elements 64, the output from the digital filter 90 may be a multi-bit binary signal, e.g., a digital word that is transmitted serially and/or in parallel.

Advantageously, in certain embodiments, the quantizing circuit 16 may facilitate the use of multi-bit memory elements 64. As described above, in traditional designs, the number of discrete data values that a memory element 64 stores may be limited by sense amps that react to noise. In contrast, the quantizing circuit 16 may be less susceptible to noise, and, as a result, the memory elements 64 may be configured to store additional data. Without the high frequency noise, the intervals between signals representative of different data values may be made smaller, and the number of data values stored by a given memory element 64 may be increased. Thus, beneficially, the quantizing circuit 16 may read memory elements 64 that store several bits of data, e.g., 2, 3, 4, 5, 6, 7, 8, or more bits per memory element 64.

Although the quantizing circuit 16 may sense the signal from the memory element 64 over a longer period of time than conventional designs, the overall speed of the memory device 12 may be improved. As compared to a conventional device, each read or write operation of the memory device 12 may transfer more bits of data into or out of the memory element 64. As a result, while each read or write operation may take longer, more data may be read or written during the operation, thereby improving overall performance. Further, in some memory devices 12, certain processes may be performed in parallel with a read or write operation, thereby further reducing the overall impact of the longer sensing time. For example, in some embodiments, the memory array 14 may be divided into banks that operate at least partially independently, so that, while data is being written or read from one bank, another bank can read or write data in parallel.

Figure 8:
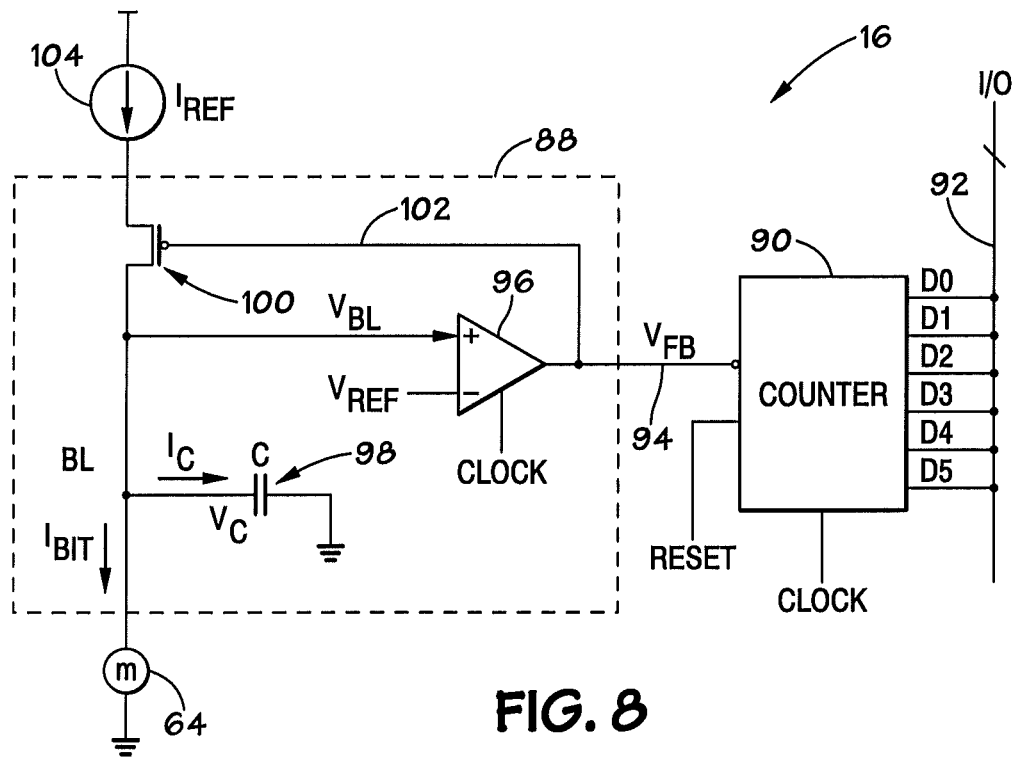
FIG. 8 illustrates a delta-sigma sensing circuit in accordance with an embodiment of the present invention.

FIG. 8 illustrates details of one implementation of the quantizing circuit 16. In this embodiment, the digital filter 90 is a counter, and the analog-to-digital converter 88 is a first-order delta-sigma modulator. The illustrated delta-sigma modulator 88 may include a latched comparator 96, a capacitor 98, and a switch 100. In other embodiments, other types of digital filters and analog-to-digital converters may be employed, such as those described below in reference to FIGS. 17 and 18.

As illustrated, an input of the counter 90 may connect to the bit-stream signal path 94, which may connect to an output of the comparator 96. The output of the comparator 96 may also connect to a gate of the switch 100 by a feedback signal path 102. The output terminal (e.g., source or drain) of the switch 100 may connect in series to one of the bit-lines 38, 40, 42, 44, or 46, and the input terminal of the switch 100 may connect to a reference current source 104 ($I_{REF}$). One plate of the capacitor 98 may connect to one of the bit-lines 38, 40, 42, 44, or 46, and the other plate of the capacitor 98 may connect to ground.

The illustrated counter 90 counts the number of clock cycles that the bit-stream 94 is at a logic high value or logic low value during the sensing time. The counter may count up or count down, depending on the embodiment. In some embodiments, the counter 90 may do both, counting up one for each clock cycle that the bit-stream has a logic high value and down one for each clock cycle that the bit-stream has a logic low value. Output terminals (D0-D5) of the counter 90 may connect to the input/output bus 92 for transmitting the count. The counter 90 may be configured to be reset to zero or some other value when a reset signal is asserted. In some embodiments, the counter 90 may be a series connection of D-flip flops, e.g., D-flip flops having SRAM or other memory for storing an initial value and/or values to be written to the memory element 64.

In the illustrated embodiment, the clocked comparator 96 compares a reference voltage ($V_{REF}$) to the voltage of one of the bit-lines 38, 40, 42, 44, or 46 ($V_{BL}$), which may be generally equal to the voltage of one plate of the capacitor 98. The comparator 96 may be clocked (e.g., falling and/or rising edge triggered), and the comparison may be performed at regular intervals based on the clock signal, e.g., once per clock cycle. Additionally, the comparator 96 may latch, i.e., continue to output, values ($V_{FB}$) between comparisons. Thus, when the clock signals the comparator 96 to perform a comparison, if $V_{BL}$ is less than $V_{REF}$, then the comparator 96 may latch its output to a logic low value, as described below in reference to FIG. 9. Conversely, if $V_{BL}$ is greater than $V_{REF}$, then the comparator 96 may latch a logic high value on its output, as described below in reference to FIG. 10. As a result, the illustrated comparator 96 outputs a bit-stream that indicates whether $V_{BL}$ is larger than $V_{REF}$, where the indication is updated once per clock cycle.

Advantageously, in some embodiments, the quantizing circuit 16 may include a single comparator (e.g., not more than one) for each column of multi-level memory elements 64. In contrast, conventional sense amplifiers often include multiple comparators to read from a multi-bit memory cell, thereby potentially increasing device complexity and cost.

The capacitor 98 may be formed by capacitive coupling of the bit-lines 38, 40, 42, 44, and 46. In other designs, this type of capacitance is referred to as parasitic capacitance because it often hinders the operation of the device. However, in this embodiment, the capacitor 98 may be used to integrate differences between currents on the bit-lines 38, 40, 42, 44, or 46 and the reference current to form the bit-stream, as explained further below. In some embodiments, the capacitor 98 may be supplemented or replaced with an integrated capacitor that provides greater capacitance than the "parasitic" bit-line capacitance.

Figure 9:
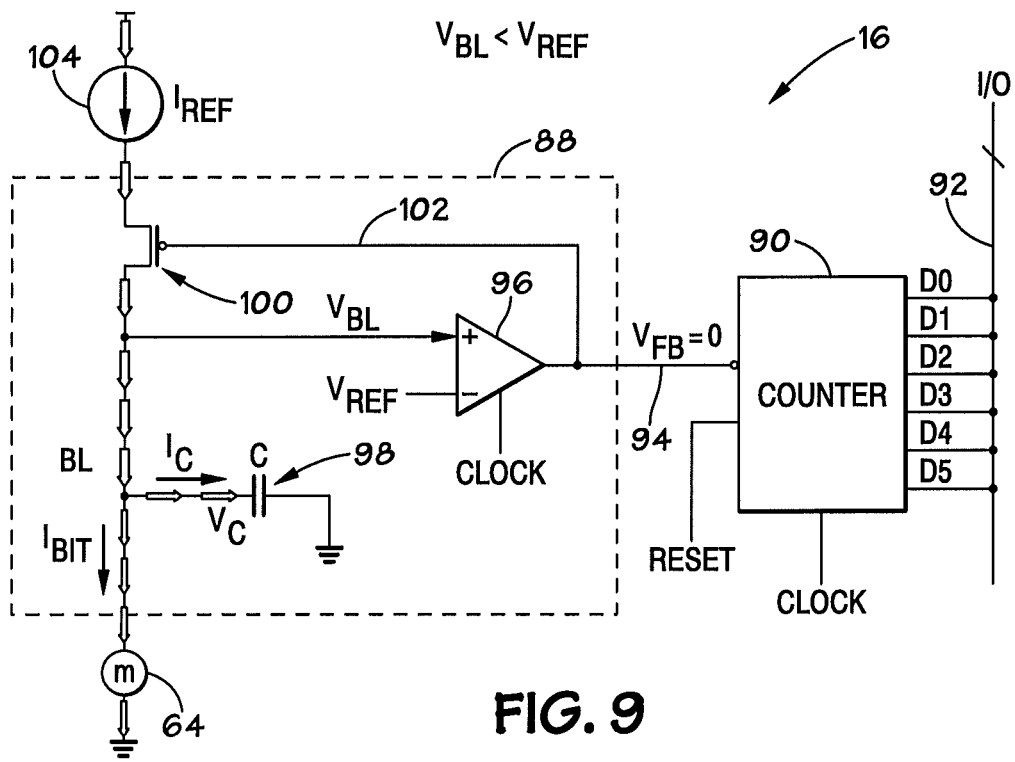
FIGS. 9 and 10 illustrate current flow during operation of the quantizing circuit of FIG. 8.
Figure 10:
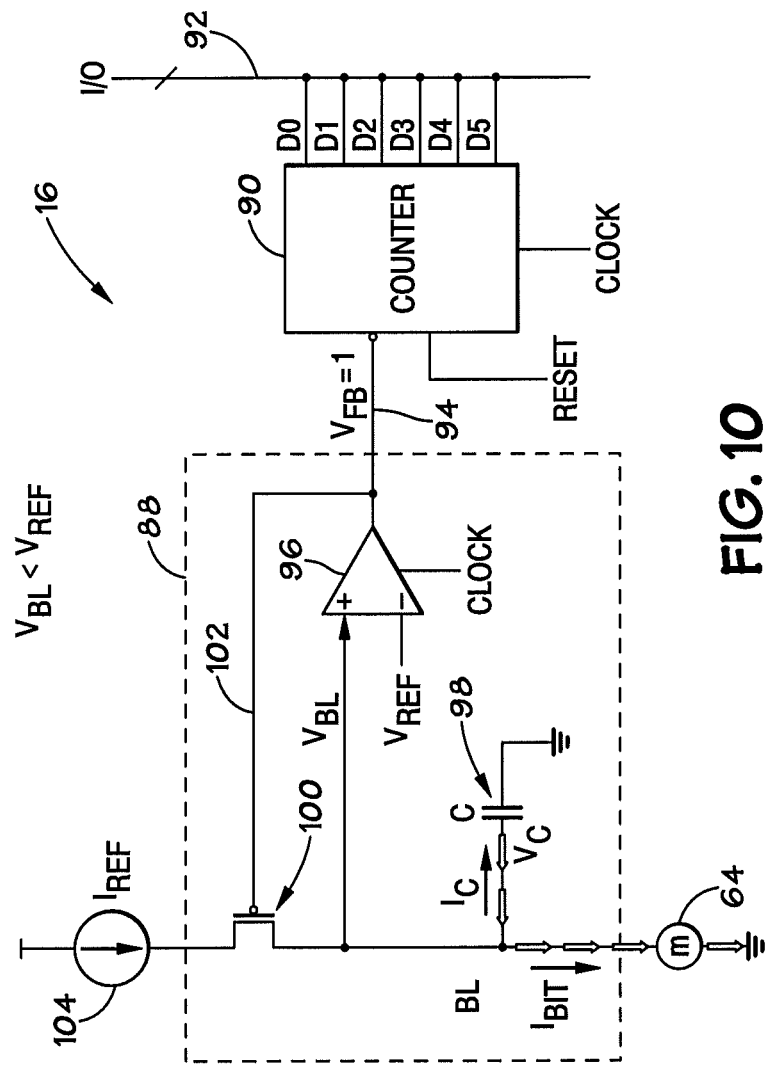

The illustrated switch 100 selectively transmits current $I_{REF}$ from the reference current source 104. In various embodiments, the switch 100 may be a PMOS transistor (as illustrated in FIGS. 8-10) or an NMOS transistor (as illustrated in FIG. 17) controlled by the $V_{FB}$ signal on the feedback signal path 102.

Figure 11:
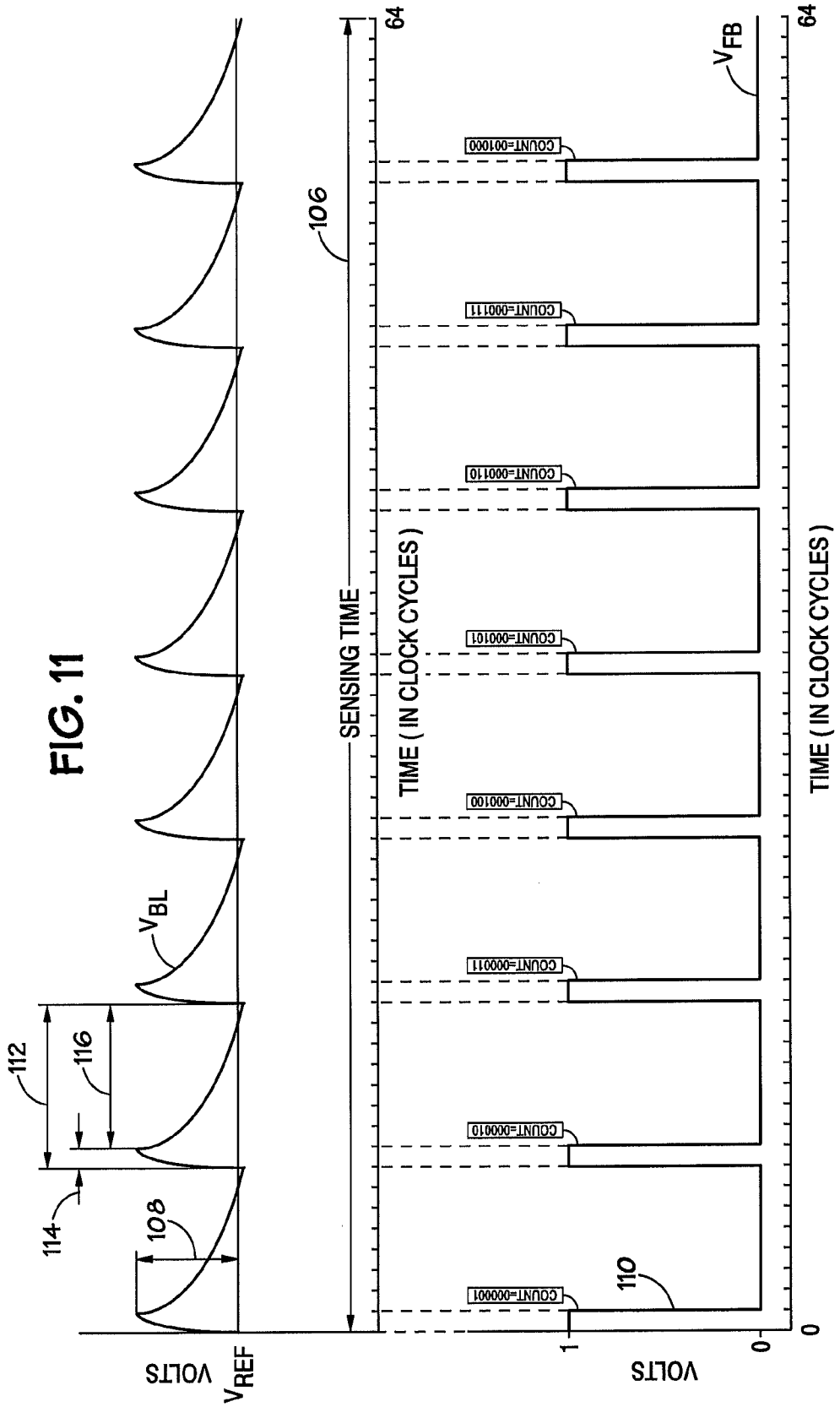
FIGS. 11-13 illustrate voltages in the quantizing circuit of FIG. 8 when sensing small, medium, and large currents, respectively.
Figure 12:
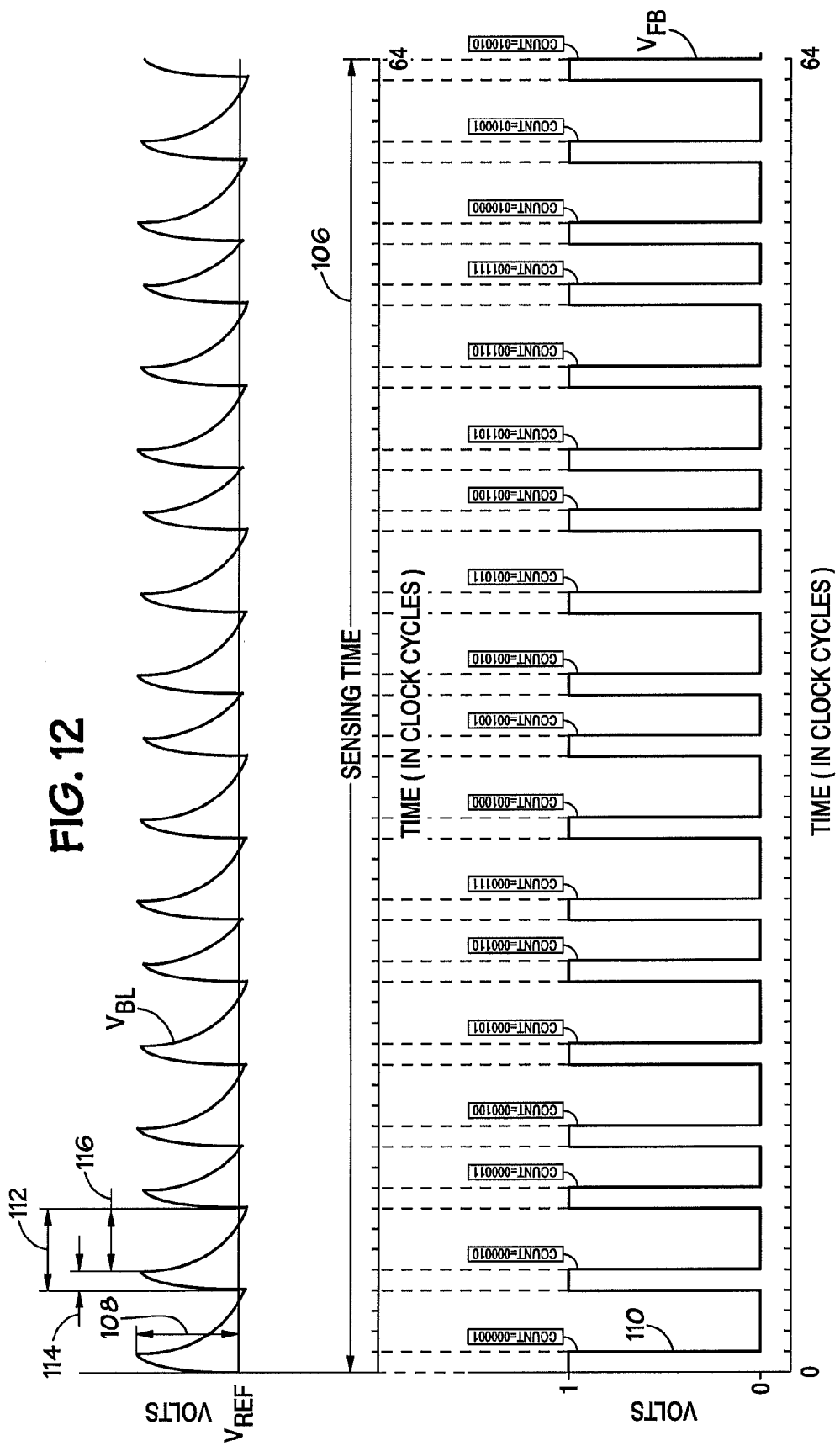
Figure 13:
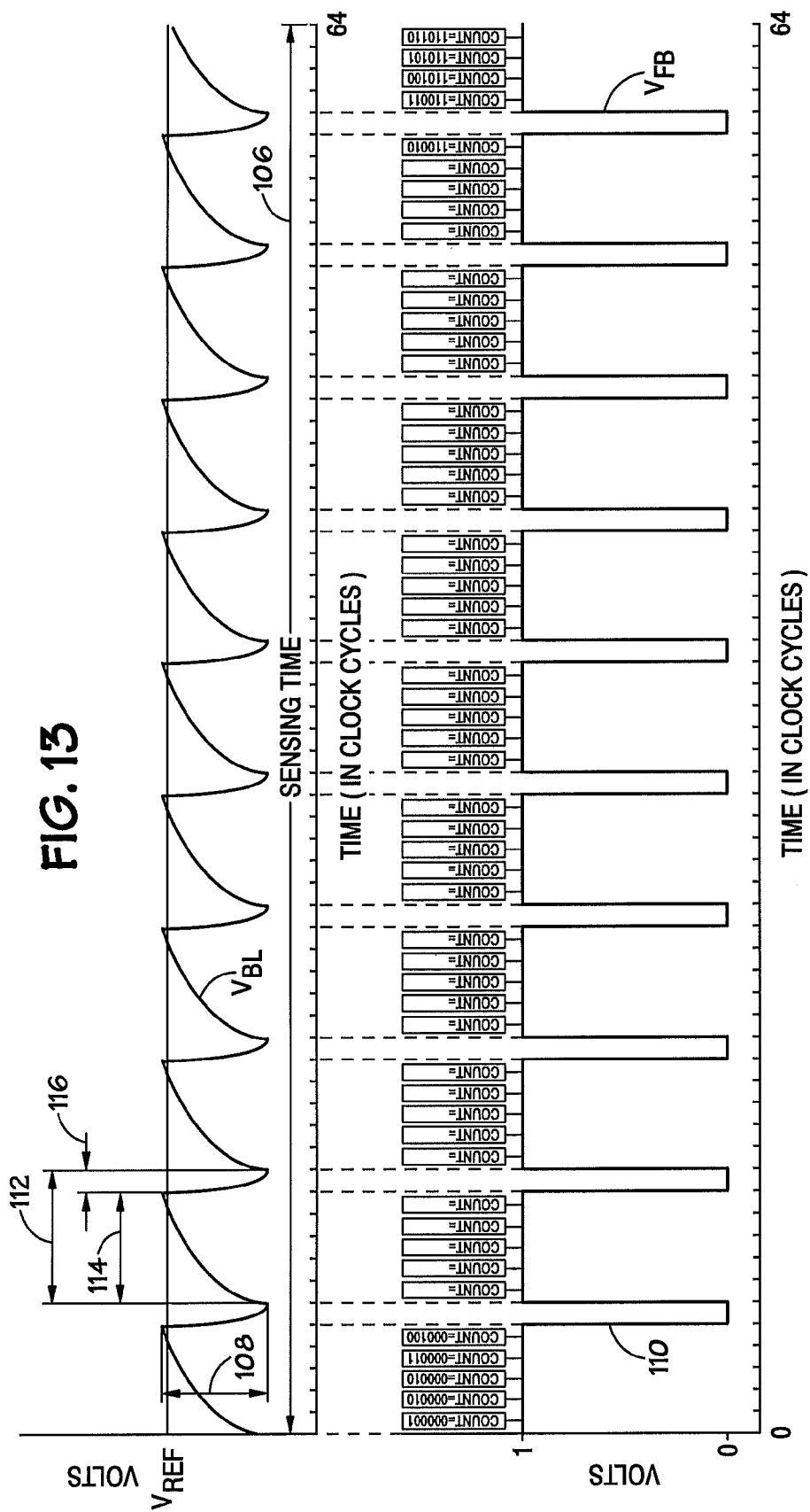

The operation of the quantizing circuit 16 will now be described with reference to FIGS. 9-12. Specifically, FIGS. 9 and 10 depict current flows in the quantizing circuit 16 when the comparator 96 is latched low and high, respectively. FIG. 11 illustrates $V_{BL}$, the bit-stream output from the comparator 96, and the corresponding increasing count of the counter 90 for a relatively small bit-line current. FIG. 12 depicts the same voltages when measuring a medium sized bit-line current, and FIG. 13 depicts these voltages when measuring a relatively large bit-line current.

To sense the current through the memory element 64, the illustrated delta-sigma modulator 88 exploits transient effects to output a bit-stream representative of the bit-line current $I_{BIT}$. Specifically, the delta-sigma modulator 88 may repeatedly charge and discharge the capacitor 98 with a current divider that subtracts the bit-line current $I_{BIT}$ from the reference current $I_{REF}$. Consequently, a large current through the memory element 64 may rapidly discharge the capacitor 98, and a small current through the memory element 64 may slowly discharge the capacitor 98.

To charge and discharge the capacitor 98, the delta-sigma modulator 88 switches between two states: the state depicted by FIG. 9 (hereinafter "the charging state") and the state depicted by FIG. 10 (hereinafter "the discharging state"). Each time the delta-sigma modulator 88 transitions between these states, the bit-stream changes from a logic high value to a logic low value or vice versa. The proportion of time that the delta-sigma modulator 88 is in the state illustrated by either FIGS. 9 or FIG. 10 may be proportional to the size of the bit-line current $I_{BIT}$ through the memory element 64. The larger the bit-line current $I_{BIT}$, the more time that the delta-sigma modulator 88 is in the state illustrated by FIG. 9, rather than the state illustrated by FIG. 10, and the more time that the bit-stream has a logic low value.

Starting with the charging state (FIG. 9), the capacitor 98 may initially accumulate a charge (e.g., become more charged). To this end, the output of the comparator 96 is latched to logic low, which, as mentioned above, may occur when $V_{BL}$ is less than $V_{REF}$. The logic low may be conveyed to switch 100 by the feedback signal path 102, and the switch 100 may close, thereby conducting the reference current $I_{REF}$ through one of the bit-lines 38, 40, 42, 44, or 46, as indicated by the larger arrows in FIG. 9. A portion of the electrons flowing through the reference current source 104 may be accumulated by the capacitor 98, as indicated by the smaller-horizontal arrows, and the remainder may be conducted through the memory element 64, i.e., the bit-line current $I_{BIT}$, as indicated by the smaller vertical arrows. Thus, the capacitor 98 may accumulate a charge, and $V_{BL}$ may increase.

The comparator 96 and the reference current source 104 may cooperate to charge the capacitor 98 for a discrete number of clock cycles. That is, when the delta-sigma modulator 88 transitions to the charging state, the delta-sigma modulator 88 may remain in this state for an integer number of clock cycles. In the illustrated embodiment, the comparator 96, the output of which is latched, changes state no more than once per clock cycle, so the switch 100, which is controlled by the output of the comparator 96, $V_{FB}$, conducts current for a discrete number of clock cycles. As a result, the reference current source 104 conducts current $I_{REF}$ through the bit-line and into the capacitor 98 for an integer number of clock cycles.

After each clock cycle of charging the capacitor 98, the delta-sigma modulator 88 may transition from the charging state to the discharging state, which is illustrated by FIG. 10, depending on the relative values of $V_{BL}$ and $V_{REF}$. Once per clock cycle (or at some other appropriate interval, such as twice per clock cycle), the comparator 96 may compare the voltage of the capacitor $V_{BL}$ to the reference voltage $V_{REF}$. If the capacitor 98 has been charged to the point that $V_{BL}$ is greater than $V_{REF}$, then the output of the comparator 96 may transition to logic high, as illustrated in FIG. 10. The logic high signal may be conveyed to the switch 100 by the feedback signal path 102, thereby opening the switch 100. As a result, the reference current source 104 may cease conducting current through the memory element 64 and into the capacitor 98, and the capacitor 98 may begin to discharge through the memory element 64.

In the present embodiment, the delta-sigma modulator 88 discharges the capacitor 98 for a discrete number of clock intervals. After each clock cycle of discharging the capacitor 98, the delta-sigma modulator 88 compares $V_{BL}$ to $V_{REF}$. If $V_{BL}$ is still greater than $V_{REF}$, then the comparator 96 may continue to output a logic high signal, i.e., $V_{FB}=1$, and the switch 100 remains open. On the other hand, if enough current has flowed out of the capacitor 98 that $V_{BL}$ is less than $V_{REF}$, then the comparator 96 may output a logic low signal, i.e., $V_{FB}=0$, and the switch 100 may close, thereby transitioning the delta-sigma modulator 88 back to the charging state and initiating a new cycle.

The counter 90 may count the number of clock cycles that the delta-sigma modulator 88 is in either the charging state or the discharging state by monitoring the bit-stream signal path 94. The bit-stream signal path 94 may transition back and forth between logic high and logic low with the output of the comparator 96, $V_{FB}$, and the counter 90 may increment and/or decrement a count once per clock cycle (or other appropriate interval) based on whether the bit-stream is logic high or logic low. After the sensing time has passed, the counter 90 may output a signal indicative of the count on output terminals D0-D5. As explained below, the count may correspond, e.g., proportionally, to the bit-line current, $I_{BIT}$.

FIGS. 11-13 illustrate voltages $V_{FB}$ and $V_{BL}$ in the quantizing circuit 16 when reading data from a memory element 64. Specifically, FIG. 11 illustrates a low-current case, in which the value stored by the memory element 64 is represented by a relatively low bit-line current. Similarly, FIG. 12 illustrates a medium-current case, and FIG. 13 illustrates a high-current case. In each of these figures, the ordinate of the lower trace represents the voltage of the bit-stream signal path 94, $V_{FB}$, and the ordinate of the upper trace illustrates the bit-line voltage, $V_{BL}$. The abscissa in each of the traces represents time, with the lower trace synchronized with the upper trace, and the duration of the time axes is one sensing time 106.

As illustrated by FIG. 11, the counter 90 is initially preset to zero (or some other appropriate value) by applying a reset signal. In some embodiments, the delta-sigma modulator 88 may undergo a number of start-up cycles to reach steady-state operation before initiating the sensing time and resetting the counter 90. At the beginning of the illustrated read operation, the delta-sigma modulator 88 is in the charging state, which charges the capacitor 98 and increases $V_{BL}$, as indicated by dimension arrow 108. At the beginning of the next clock cycle, the comparator 96 compares the bit-line voltage to the reference voltage and determines that the bit-line voltage is greater than the reference voltage. As a result, the bit-stream signal path 94 ($V_{FB}$) transitions to a logic high voltage, and the delta-sigma modulator 88 transitions to the discharging state. Additionally, the counter 90 increments the count by one to account for one clock cycle of the bit-stream signal 94 holding a logic low value. Next, the charge stored on the capacitor 98 drains out through the memory element 64, and the bit-line voltage drops until the comparator 96 determines that $V_{BL}$ is less than $V_{REF}$, at which point the cycle repeats. The cycle has a period 112, which may be divided into a charging portion 114 and a discharging portion 116. Once during each cycle in the sensing time 106, the count stored in the counter 90 may increase by one. At the end of the sensing time 106, the counter 90 may output the total count.

A comparison of FIG. 11 to FIGS. 12 and 13 illustrates why the count correlates with the bit-line current. In FIG. 13, the high-current case, the stored charge drains from the capacitor 98 quickly, relative to the other cases, because the bit-line current $I_{BIT}$ is large and, as a result, the delta-sigma modulator 88 spends more time in the charging state than the discharging state. As a result, the bit-stream has a logic low value for a large portion of the sensing time 106, thereby increasing the count.

The capacitance of the capacitor 98 may be selected with both the clock frequency and the range of expected bit-line currents in mind. For example, the capacitor 98 may be large enough that the capacitor 98 does not fully discharge (e.g., saturate) when the bit-line current $I_{BIT}$ is either at its lowest expected value or at its highest expected value. That is, in some embodiments, the capacitor 98 generally remains in a transient state while reading the memory element 64. Similarly, the frequency at which the comparator 96 is clocked may affect the design of the capacitor 98. A relatively high frequency clock signal may leave the capacitor 98 with relatively little time to discharge or saturate between clock cycles, thereby leading a designer to choose a smaller capacitor 98.

Similarly, the size of the reference current may be selected with the range of expected bit-line currents in mind. Specifically, in certain embodiments, the reference current is less than the largest expected bit-line current $I_{BIT}$, so that, in the case of maximum bit-line current $I_{BIT}$, the capacitor 98 can draw charge from the reference current while the rest of the reference current flows through the memory element 64.

Figure 14:
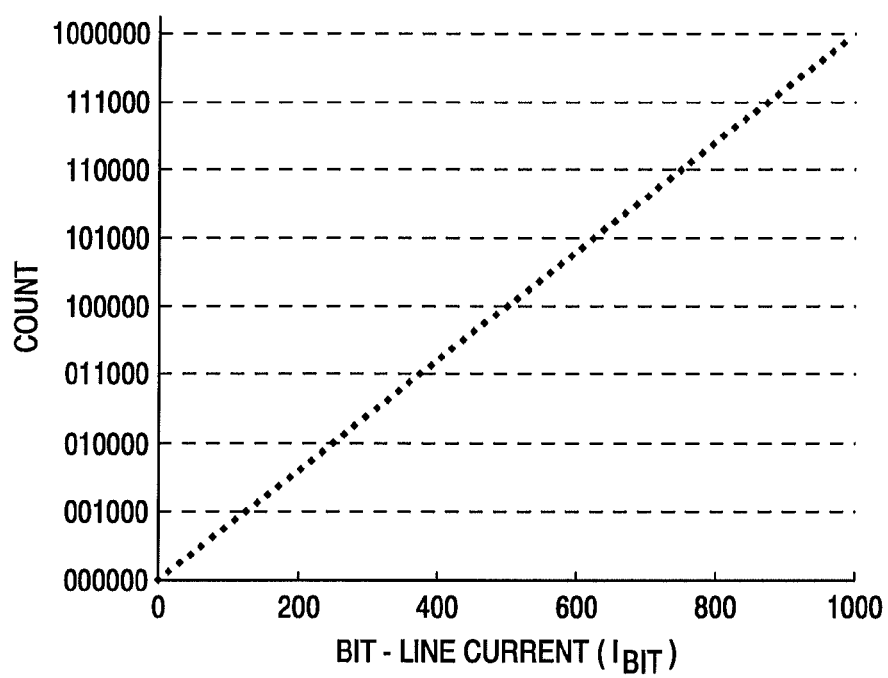
FIG. 14 is a graph of bit-line current versus counter output for the quantizing circuit of FIG. 8.

FIG. 14 illustrates the relationship between the bit-line current $I_{BIT}$ and the count for the presently discussed embodiment. As illustrated by FIG. 14, the count corresponds with (e.g., is generally proportional to) the bit-line current $I_{BIT}$. This relationship is described by the following equation (Equation 1), in which $N_{ST}$ represents the number of clock cycles during the sensing time:

$$I_{BIT}/I_{REF} = \text{Count}/N_{ST}$$

Thus, in the illustrated embodiment, the count corresponds with (e.g., is indicative of) the bit-line current $I_{BIT}$, which corresponds with the value stored by the memory element 64.

Advantageously, the quantizing circuit 16 may quantize (e.g., categorize) the bit-line current $I_{BIT}$ as falling into one of a large number of categories, each of which is represented by an increment of the count. In doing so, in some embodiments, the quantizing circuit 16 may resolve small differences in the bit-line current $I_{BIT}$. The resolution of the quantizing circuit 16 may be characterized by the following equation (Equation 2), in which $I_{MR}$ represents the smallest resolvable difference in bit-line current $I_{BIT}$, i.e., the resolution of the quantizing circuit 16:

$$I_{MR} = I_{REF}/N_{ST}$$

Thus, the resolution of the quantizing circuit 16 may be increased by increasing the sensing time or the clock frequency or by decreasing $I_{REF}$, which may limit the maximum cell current since $I_{MR}$ is less than $I_{REF}$.

The resolution of the quantizing circuit 16 may facilitate storing multiple bits in the memory element 64 or sensing multiple levels of light intensity in an image sensor element. For example, if the quantizing circuit 16 is configured to quantize (e.g., categorize) the bit-line current $I_{BIT}$ into one of four different levels, then the memory element 64 may store two-bits of data or, if the quantizing circuit 16 is configured to categorize the bit-line current $I_{BIT}$ into one of eight different current levels, then the memory element 64 may store three-bits of data. For the present embodiment, the number of bits stored by the memory element 64 may be characterized by the following equation (Equation 3), in which $N_B$ represents the number of bits stored by a memory element 64 and $I_{RANGE}$ represents the range of programmable bit-line currents through the memory element 64:

$$N_B = \log(I_{RANGE}/I_{MR})/\log 2$$

In short, in the present embodiment, greater resolution translates into higher density data storage for a given memory element 64.

Figure 15:
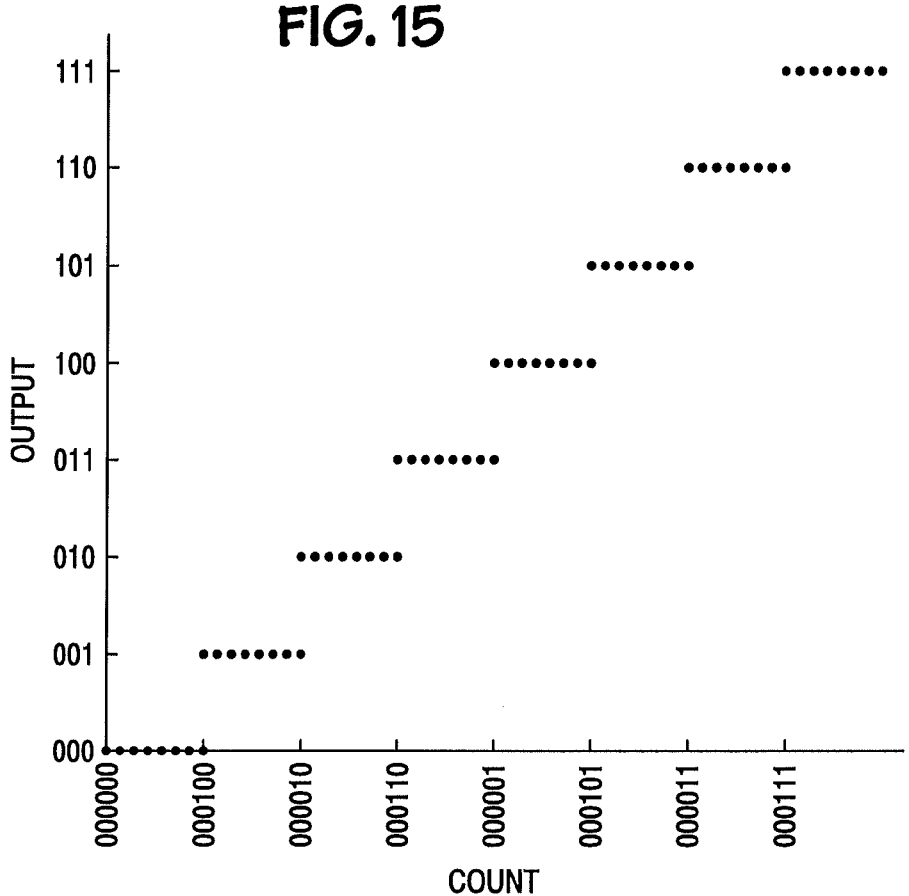
FIG. 15 is a graph of count versus quantizing circuit output in accordance with an embodiment of the present invention.

FIG. 15 is a graph that illustrates one way in which the counter 90 may be configured to further reduce the effects of noise. In FIG. 15, the abscissa represents the count, and the ordinate represents the output of the quantizing circuit 16. In the present embodiment, the three-least-significant digits of the count are disregarded as potentially corrupted by noise. That is, D0-D2 (FIG. 8) either do not connect to the input/output bus 92 or are not interpreted as conveying data that is stored by the memory element 64. As a result, a range of counter values may represent a single data value stored by the memory element 64. For example, in the present embodiment, count values ranging from 00 1000 to 00 1111 are construed as representing a data value of 001. Representing data in this manner may further reduce the effects of noise because, even if noise affects the count, in many embodiments, it would have to affect the count in a consistent manner over a substantial portion of the sensing time to affect the more significant digits of the count. That is, disregarding less significant digits may lower the cutoff frequency of the counter 90. In other embodiments, fewer, more, or no digits may be truncated from the count as potentially representing noise.

Truncating less significant digits may introduce a rounding error, or a downward bias, in the output. This effect may be mitigated by presetting (e.g., driving latches to a particular state in advance of counting or storing a value in memory) the counter 90 in a manner that accounts for this bias. The counter 90 may be preset either before reading from the memory element 64 or before writing to the memory element 64. In some embodiments, the preset value may be one-half of the size of the range of counter values that represent a single output value. In other words, if m digits are truncated from the output, then the counter 90 may be preset to one-half of $2^m$ before reading from a memory element 64 or before writing to the memory element 64. In some embodiments, the memory in the counter 90 may store this preset value.

Truncating less significant digits is believed to reduce the likelihood of an error occurring. However, under some conditions, or in embodiments that do not truncate less significant digits, errors may still occur. These errors may be prevented, and in some cases corrected, by some of the embodiments described below. Specifically, FIGS. 16 and 17 illustrate an embodiment configured to detect errors, and FIGS. 18 and 19 illustrate an embodiment configured to detect and correct errors. Generally speaking, these embodiments encode data to be stored with redundant data, i.e., data about the data to be stored, and then when reading this encoded data, decode it by determining whether the data that was read is internally consistent, i.e., whether the encoded data that was read would produce the redundant data that it includes. If the data that was read does not have the encoded internal relationships, the embodiments described below may flag the data as potentially including an error or take other remedial actions.

FIG. 16 shows a memory device 120 configured to detect errors in stored data, e.g., corrupted bits. This memory device 120 includes the previously described memory array 14, quantizing circuitry 16, column decoder 18, row drivers 22, and input/output bus 92. Additionally, in this embodiment, an error detection module 122 may be disposed on (e.g., coupled to) the input/output bus 92. In other embodiments, multiple error detection modules 122 may be disposed between the column decoder 18 and the quantizing circuitry 16.

The illustrated error detection module 122 includes two components: an encoder 124 and a decoder 126. Both of these components 124 and 126 may be coupled to the input/output bus 92. In this embodiment, the encoder 124 receives data flowing towards the memory array 14 (i.e., data to be stored), and the decoder 126 receives data flowing from the memory array 14 (i.e., read data). In addition to receiving read data, the illustrated decoder 126 may be configured to output an error signal, the causes and implications of which are described further below.

The illustrated encoder 124 is configured to receive incoming data and, in response, perform two functions: 1) create redundant data, and 2) associate (e.g., link) the redundant data with the incoming data. Below, each of these functions is briefly described with one introductory example, and then after describing the decoder 126 with the same example, several additional examples of encoding and decoding are described in reference to FIG. 17, which depicts the operation of the error detection module 122.

The redundant data may be created in a variety of fashions, depending upon the embodiment of the encoder. Generally, the redundant data is determined by the incoming data and is produced according to one or more encoding rules. For example, the redundant data may be a parity bit, which is either one, if the incoming data includes an odd number of ones, or zero, if the incoming data includes an even number of ones. Under this encoding rule, a seven-bit incoming data word of 1 011 001 produces a parity bit of 0, because the seven-bit incoming data word includes an even number of ones (specifically, four). In contrast, an incoming data word of 1 011 000 produces a parity bit of 1, because it includes an odd number of ones. In this embodiment, the redundant data (i.e., the parity bit) is redundant because it is entirely determined by the incoming data word. That is, the redundant data does not include new information; it is data about the incoming data, and it could be re-created based on the incoming data.

In addition to creating the redundant data, the encoder 124 may also associate of the redundant data with the incoming data. Associating may take a variety of forms, as long as the redundant data can be retrieved along with the incoming data with which it was created. For instance, returning to the parity bit example, the parity bit may be appended to the incoming data word, so the seven-bit incoming data word of 1 011 001 may leave the encoder as an encoded data word of 01 011 001, with the parity bit of 0 appended as the most significant digit of the encoded data word.

The encoder 124 may use a variety of techniques other then appending to associate redundant data with incoming data. For instance, the redundant data may be associated with the incoming data by performing some other reversible mathematical operation, such as adding, subtracting, multiplying, dividing, etc. The redundant data, in some embodiments, may be associated with the incoming data without combining the two. For instance, the incoming data may be stored in one location, and the redundant data may be stored in a corresponding location, e.g., an adjacent memory element or a memory element indicated by a look-up table. In another example, the redundant data may be associated with the incoming data by linking data that indicates how or where to retrieve redundant data that corresponds with incoming data. The relationship by which redundant data is associated with incoming data may be referred to as an association rule. In short, the illustrated encoder 124 creates the redundant data and then ties it to the incoming data, so that both can be retrieved together.

The illustrated decoder 126 is configured to reverse this process. That is, the illustrated decoder 126 receives outgoing encoded data read from the data locations 64, identifies the redundant data, and determines whether the outgoing encoded data is consistent with the redundant data. For example, in the parity-bit embodiment, the decoder may receive outgoing data of 01 011 001. The decoder 126 may identify the most significant digit of the outgoing data based on the association rule with which the encoder 124 associated this redundant data, i.e., appending it as the most significant digit. Having identified the redundant data as 0 and the stored data as 1 011 001, the decoder 126 may check these values for consistency. To this end, in the parity bit example, the decoder 126 may re-apply the encoding rule and determine whether the same redundant value is re-created by the read data. In this case, the read data 1 011 001 produces redundant data of 0 (because it includes an even number of ones), which corresponds with the redundant data 0, which was extracted from the outgoing data. Based on this comparison, the decoder 126 may determine that the data 1 011 001 does not include an error.

On the other hand, if the data was corrupted after encoding, the decoder 126 may identify this error. Continuing with the same parity-bit example, assume the decoder 126 receives outgoing data of 01 011 000, because an error flipped (i.e., corrupted) the last bit. In this example, the decoder 126 identifies the most significant digit 0 as the redundant data based on the association rule, and then, determines whether it is consistent with the rest of the outgoing data 1 011 000 based on the encoding rule. Because the stored, non-redundant data includes an odd number of ones, according to the encoding rule, the redundant data should be 1. However, in this case, the redundant data that was retrieved is 0, which is different from what the stored, non-redundant data indicates the redundant data should be, i.e., 1. Thus, the outgoing encoded data is not internally consistent according to the encoding rule. As a result, in the present embodiment, the decoder 126 may output an error signal.

In the illustrated memory device 120, the error detection module 122 is formed on an integrated semiconductor device with the other components illustrated by FIG. 16. Because the error detection module 122 is integrally formed with the rest of the memory device 120, the error detection module 122 may communicate with the memory array 14 with relatively little latency. In other embodiments, the error detection module 122, or parts thereof, may be disposed off-chip, such as in a memory controller.

FIG. 17 illustrates an example of an error detection process 128, which may be performed by some embodiments of the error detection module 122. The process 128 begins with receiving incoming data to be stored, as illustrated by block 130, and encoding this incoming data with redundant data to generate encoded data, as illustrated by block 132. As discussed above, encoding generally includes generating redundant data based on the encoding rule and then associating the redundant data with the incoming data based on the association rule.

After encoding, the encoded data may be written to a data location, as illustrated by block 134, and later, read from the data location, as illustrated by block 136. Writing and reading the encoded data may be performed with the previously described delta-sigma modulator 88 (FIG. 8). When writing the encoded data, a property of a data location 64 may be repeatedly incrementally adjusted and measured to determine whether the data location 64 stores the encoded data. For instance, a charge on a floating gate of a floating gate transistor may be repeatedly incrementally increased and measured until the charge corresponds to the encoded data being written. In another example, the crystallinity of a phase change material may be repeatedly incrementally adjusted and its resistance measured until the resistance of the phase change material indicates the encoded data.

Some time after writing, the data location may be read, and the read data may then be decoded, as illustrated by block 138. Below, several examples of encoding and decoding are described.

One type of encoding, which is discussed above, is a parity bit that indicates whether the incoming data has an odd or even number of ones. Another type of encoding is a data repetition. In this embodiment, the incoming data is repeated to form the redundant data. That is, the incoming data is itself the redundant data, so for example incoming data of 101 111 produces redundant data of 101 111. This redundant data may then be associated with the incoming data. For instance, the incoming data of 101 111 may be appended to the redundant data of 101 111 to produce encoded data of 101 111 101 111.

Data encoded by repetition may be decoded by comparing the first half of the read data to the second half of the read data. For example, if the previously described encoded data of 101 111 101 111 is read from memory, the first half, 101 111, may be compared to the second half, 101 111, to determine whether an error occurred during writing or reading. In this case, the first half and second half are identical, so no error is detected. On the other hand, if encoded data of 001 111 101 111 is read from memory, comparing the first half 001 111 to the second half 101 111, indicates that an error occurred during reading or writing, because the first half does not match the second half. That is, the encoded data read from the data location is not internally consistent according to the encoding rule, which dictates that the first half of the encoded data is the same as the second half of the encoded data.

Embodiments are not limited to parity bit encoding or repetition encoding. In various embodiments, the process 128 may employ a number of other types of encoding. For instance, the process 128 may include encoding with a cyclic redundancy check (CRC), a check sum, Fletcher's checksum, Adler-32, hash functions, or a Hamming code. Some of these embodiments are described further below, in reference to FIGS. 18 and 19.

Returning to the process 128 of FIG. 17, after the redundant data is separated from the read data, it is determined whether the redundant data is consistent with the read data, as illustrated by block 140. As described above, consistency may be determined by applying the encoding rule to the non-redundant portion of the read data and comparing the result to the read redundant data. If they match, then the read data is output, as illustrated by block 142. Outputting the read data may include outputting either the encoded read data or the non-redundant portion of the read data. Embodiments that output encoded data may decode this data at multiple points along the data's transmission path to verify accurate transmission.

If the redundant data is not consistent with the read data, then an error signal may be output, as illustrated by block 144, and the encoded data may be re-read, as illustrated by block 146. After re-reading the encoded data, the process 128 may return to the act illustrated by block 138 to repeat decoding and the consistency check. In some embodiments, this process may repeat a number of times until the read data is consistent with the redundant data or a predetermined number of repetitions is reached.

Some embodiments may use error signals to dynamically tune the operation of the quantizing circuitry 16. In certain embodiments, the quantizing circuitry 16 may adjust the sensing time in response to an error signal. For example, in the event of an error, the quantizing circuitry 16 may double the sensing time and divide the counter 90 output by two to increase its resolution. In some embodiments, the quantizing circuitry 16 may increase its sensing time with each consecutive error signal until a predetermined maximum number of error signals is reached. Conversely, if the rate of error signals decreases, the quantizing circuitry 16 may decrease the sensing time.

In some embodiments, an encoded word or packet including both the incoming data and the resulting redundant data may be stored in a single data location 64. As noted above, the resolution of the delta-sigma modulator 88 may facilitate storing multiple bits in a single data location 64. Some embodiments may store enough bits that both the redundant data and the incoming data are stored in a single data location 64. In other embodiments, the redundant data, the incoming data, or both may be divided among multiple data locations 64.

Certain embodiments may encode enough redundant data to both detect and correct errors. FIG. 18 illustrates a memory device 148 with an error correction module 150. The error correction module 150 may include an encoder 152 and a decoder 154. As explained below, the encoder may encode redundant data that, in the event of an error, may be used by the decoder to re-construct the original, incoming data. Several examples of this type of encoding are described below.

The encoder 152 may employ repetition to encode incoming data and support error correction. For example, the encoder 152 may generate two repetitions of the incoming data as the redundant data, so if the encoder 152 receives incoming data of 110, it may generate redundant data of 110 110. This redundant data may then be associated with the incoming data by, for example, appending the redundant data to form encoded data of 110 110 110.

After encoding the data, the memory device 148 may store the encoded data and, later, read the encoded data, e.g., with the quantizing circuitry 16. The read data may be received by the decoder 154 and decoded.

To decode the read data, the decoder 154 may reverse the encoding process. Continuing with the data repetition example, if 110 110 110 was stored, and 110 110 110 is read, the decoder 154 may identify 110 110 as the redundant data, and determine that the redundant data is consistent with the read data. That is, 110 repeated twice is 110 110.

If, due to an error, the read data is not internally consistent, the decoder 154 may correct the error. To this end, the decoder 154 may determine the most likely correct data. For example, if the read data is 100 110 110, the decoder 154 may determine that in two out of the three repetitions the middle digit is 1, thereby indicating that the correct value for the middle digit is probably 1. Based on this comparison, the decoder 154 may re-construct the corrected data as 110, even though the read data included an error. In some instances, the error may include two errors. For example, if the read data is 100 110 111, the decoder 154 may still determine the most likely correct data by comparing the three repetitions and selecting the most common value of each digit. In two out of three of the repetitions, the first digit is 1, the second digit is 1, and the third digit is 0. Based on this analysis, the decoder 154 may output a value of 110.

Other types of encoding may consume less memory than repetition while still supporting some degree of error correction. One example of such an encoding system is Hamming codes. In this type of encoding, the redundant data is formed based on overlapping parity bits, i.e., bits that indicate whether a group of digits has an even (or odd) number of ones, where the groups of digits described by the parity bits overlap one another. As explained below, an error can be both detected and corrected based on which of the overlapping parity bits is inconsistent with the encoded data. To explain error correction with Hamming codes, a specific example is described, followed by a more general description.

In one example of Hamming codes, a four-bit block of incoming data is encoded with three bits of redundant data. This is referred to as "Hamming 7-4 code," because it produces an encoded data word with seven bits total, four of which are the original non-redundant data (and the other three of which are redundant parity bits). As with the previous embodiments, this code can be described in terms of an association rule and an encoding rule.

Under the association rule for the Hamming 7-4 code, the parity bits and original data bits are positioned at certain locations in the encoded data word. Specifically, the first two digits and the fourth digit are parity bits, and the third and fifth through seventh are the incoming data word. Thus, a Hamming 7-4 code word has the following sequence, with parity bits designated with a "$P_x$" and data bits designated with a "$D_y$": $P_1P_2D_1P_3D_2D_3D_4$. The reason for this association rule has to do with matrix operations used to generally and concisely describe multiple variants of Hamming codes, some of which are described below.

Under the encoding rule for the Hamming 7-4 code, each of the parity bits, $P_1$ through $P_3$, may be calculated based on the following overlapping parity relationships (referred to as equations 4, 5 and 6, respectively), where the function "Parity{data}" produces a zero if the data has an even number of ones and a one if the data has an odd number of ones:

$P_1$=Parity {$D_1 D_2 D_4$}

$P_2$=Parity {$D_1 D_3 D_4$}

$P_3$=Parity {$D_2 D_3 D_4$}

Based on these equations, a Hamming 7-4 code converts a four-bit data block of 1 010 to an encoded data word of 1 011 010 with the following steps. First, the four digits of incoming data are designated for insertion into the above equations. So, $D_1$=1, the first digit; $D_2$=0; $D_3$=1; and $D_4$=0, the last digit. Next, $D_1$ through $D_4$ are applied to the equations above, so for example, $P_1$=Parity {100}, which is equal to 1 because an odd number of digits in 100 are ones. Similarly, $P_2$=Parity {110}, or 0; and $P_3$=Parity {010}, or 1. Finally, these parity bits can be associated with the data bits in the sequence introduced above, $P_1P_2D_1P_3D_2D_3D_4$, to produce an encoded word of 1 011 010. As explained below, this encoded word includes sufficient redundant data (i.e., the parity bits) to both detect a single-bit error and correct the error.

To detect and correct errors with the Hamming 7-4 code, the decoder 154 may examine the internal consistency of an outgoing encoded word. That is, the decoder 154 may verify that the data values $D_1$ through $D_4$, in the third, and fifth through seventh digits of the outgoing encoded word, produce the parity values $P_1$ through $P_3$, in the first, second, and fourth digits. To this end, the decoder 154 may apply the data values $D_1$ through $D_4$ to equations 4 through 6 above. The output of the equations may be compared to the parity bits in the outgoing encoded word, and if any parity bits do not match, they may be designated as an inconsistent parity bit. Depending on the number of inconsistent parity bits, and which parity bits are inconsistent, the decoder 154 may take different actions.

If there are no inconsistent parity bits, then decoder 154 may recognize the data as uncorrupted, and transmit the read data, either as encoded data for subsequent re-decoding or as the original data word of $D_1$ through $D_4$. Conversely, if there are any inconsistent parity bits, the decoder 154 may take further steps to correct the error.

If a single parity bit is inconsistent with the rest of the outgoing encoded data word, then the parity bit itself may be identified as the corrupted bit. It is important to note than any of the seven bits in the encoded data word can become corrupted, included the redundant data. However, corrupted parity bits may produce a specific kind of inconsistency. The single, flawed parity bit may be identified as the corrupted bit because each of the data bits $D_1$ through $D_4$ are included in the calculation of at least two of the parity bits, as indicated above by equations 4-6. Consequently, if one of the data bits $D_1$ through $D_4$ is corrupted, two or more of the parity bits should be inconsistent with the rest of the encoded word. By process of elimination, a parity bit is designated as the corrupted bit.

If there are two or three inconsistent parity bits (i.e., if two or three encoded parity bits do not correspond with the parity bits calculated by the decoder 154), then the decoder 154 may determine that a non-redundant, original data bit is corrupted and correct the error based on which of the parity bits are inconsistent. The flawed data bit may be identified based on equations 4 through 6 listed above. The decoder 154 may identify which of the data values $D_1$ through $D_4$ is common to the equations for the inconsistent parity bits, an based on the result, the flawed data value may be identified. For example, $D_1$ is a factor in the equation for $P_1$ and $P_2$ but not $P_3$, so if $P_1$ and $P_2$ are inconsistent parity bits, then $D_1$ may be identified as the flawed bit. To correct the flawed bit, it may be reversed, or flipped. In another example, $D_4$ is the data bit that is common to the equation for all three parity bits, so if $P_1$, $P_2$, and $P_3$ are all inconsistent with the rest of the encoded data word, then $D_4$ may be identified as the corrupted bit and flipped. Thus, the Hamming 7-4 code may identify and correct single bit errors.

Variants of the Hamming 7-4 code may identify multiple bit errors and correct single bit errors. For instance, some embodiments may employ a Hamming 8-4 code, which includes four parity bits for four bits of incoming data. These embodiments may operate similarly to the previously described Hamming code, except the additional parity bit may be calculated based on all four of the data bits, i.e., $P_4$=Parity {$D_1 D_2 D_3 D_4$}. When decoding, if the fourth parity bit is inconsistent, then the decoder 154 may transmit an error signal indicating a multiple-bit error.

Embodiments may employ other error-correction capable encoding. For example, other variants of Hamming codes may include larger or smaller encoded data words or more or less redundancy. Generally, these codes may be referred to as Hamming B-C codes, wherein "B" represents the number of bits in an encoded word and "C" represents the number of non-redundant data bits. More or less redundancy may be selected based on a tradeoff between the risk of undetected or uncorrected errors and memory density. Some embodiments may employ other types of error correcting codes, such as Reed-Muller code, Binary Golay code, convolutional code, turbo code, Reed-Solomon code, or BCH (Bose, Ray-Chaudhuri, Hocquenghem) code.

FIG. 19 illustrates an exemplary error correction process 156. The illustrated process begins with receiving data to be stored, as illustrated by block 158, and encoding the incoming data with redundant data to generate encoded data, as illustrated by block 160. Encoding may include employing one of the above-mentioned coding schemes. Next, the encoded data may be written to a data location, as illustrated by block 162. In some embodiments, writing the encoded data may include writing an entire encoded data word to a single data location or more than one data location. Later, the encoded data may be read from the data location(s), as illustrated by block 164. Both reading and writing may include sensing one or more data locations with the previously described delta-sigma modulator. After reading the encoded data, the encoded data may be decoded to identify the read redundant data and the read non-redundant data, as illustrated by block 166. Decoding may include determining whether the read redundant data is consistent with the rest of the read data, as illustrated by block 160. If they are consistent, then the process 156 outputs the read data, as illustrated by block 170. Outputting the read data may include outputting the read data in its encoded form for later, post-transmission, decoding, or outputting the read data without the redundant data.

If the read redundant data is not consistent, then it is determined whether the redundant data is sufficient to correct the read data, as illustrated by block 172. This may depend on the number of bits of redundant data, the size of the encoded data word, and the number of errors. For example, the Hamming 8-4 code may correct a single corrupted bit and detect, but not correct, two corrupted bits. If the redundant data is sufficient to correct the read data, then the read data is corrected based on the redundant data, as illustrated by block 174.

Alternatively, if the redundant data is not sufficient to correct the read data, an error signal is output, as illustrated by block 176. As described above, error signals may be used to tune the operation of the quantizing circuitry 16. It should be noted, however, some embodiments may not output an error signal.

Next, in response to the determination that the redundant data is insufficient to correct the read data, the encoded data may be re-read, as illustrated by block 170, and the process 156 may return to the block labeled 166 to decode the re-read data. This cycle may repeat a predetermined number of times before the stored data is designated as being unreadable. In some embodiments, the data location may be permanently designated as corrupted or damaged, and the memory device may stop writing to the data location.

In summary, the process 156 may both detect and correct data errors. The process 156 may encode incoming data with redundant data and, then, decode the encoded data to determine whether any inconsistencies have arisen as a result of corrupted bits. The process 156 may either identify corrupted bits and flip them or determine that the read data is too corrupted to be corrected. Advantageously, error correction and detection may tend to reduce the rate at which a memory device outputs flawed data.

Figure 20:
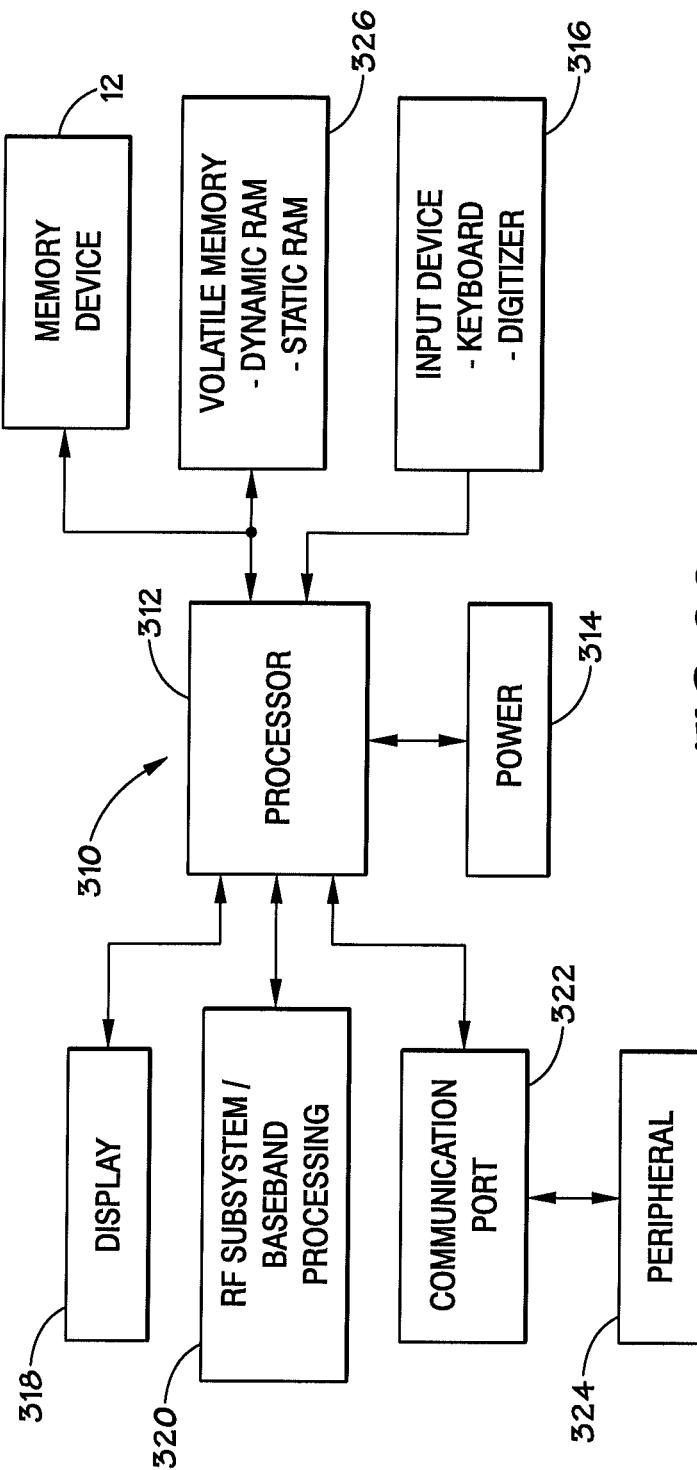
FIG. 20 illustrates an example of a system that includes the electronic device of FIG. 2.

FIG. 20 depicts an exemplary processor-based system 310 that includes the memory device 12 (FIG. 2). Alternatively or additionally, the system 310 may include the imaging device 13. The system 310 may be any of a variety of types such as a computer, pager, cellular phone, personal organizer, control circuit, etc. In a typical processor-based system, one or more processors 312, such as a microprocessor, control the processing of system functions and requests in the system 310. The processor 312 and other subcomponents of the system 310 may include quantizing circuits, such as those discussed above.

The system 310 typically includes a power supply 314. For instance, if the system 310 is a portable system, the power supply 314 may advantageously include a fuel cell, permanent batteries, replaceable batteries, and/or rechargeable batteries. The power supply 314 may also include an AC adapter, so the system 310 may be plugged into a wall outlet, for instance. The power supply 314 may also include a DC adapter such that the system 310 may be plugged into a vehicle cigarette lighter, for instance.

Various other devices may be coupled to the processor 312 depending on the functions that the system 310 performs. For instance, a user interface 316 may be coupled to the processor 312. The user interface 316 may include buttons, switches, a keyboard, a light pen, a mouse, a digitizer and stylus, and/or a voice recognition system, for instance. A display 318 may also be coupled to the processor 312. The display 318 may include an LCD, an SED display, a CRT display, a DLP display, a plasma display, an OLED display, LEDs, and/or an audio display, for example. Furthermore, an RF sub-system/baseband processor 320 may also be coupled to the processor 312. The RF sub-system/baseband processor 320 may include an antenna that is coupled to an RF receiver and to an RF transmitter (not shown). One or more communication ports 322 may also be coupled to the processor 312. The communication port 322 may be adapted to be coupled to one or more peripheral devices 324 such as a modem, a printer, a computer, or to a network, such as a local area network, remote area network, intranet, or the Internet, for instance.

The processor 312 generally controls the system 310 by implementing software programs stored in the memory. The memory is operably coupled to the processor 312 to store and facilitate execution of various programs. For instance, the processor 312 may be coupled to the volatile memory 326 which may include Dynamic Random Access Memory (DRAM) and/or Static Random Access Memory (SRAM). The volatile memory 326 is typically large so that it can store dynamically loaded applications and data. As described further below, the volatile memory 326 may be configured in accordance with embodiments of the present invention.

The processor 312 may also be coupled to the memory device 12. The memory device 12 may include a read-only memory (ROM), such as an EPROM, and/or flash memory to be used in conjunction with the volatile memory 326. The size of the ROM is typically selected to be just large enough to store any necessary operating system, application programs, and fixed data. Additionally, the non-volatile memory 328 may include a high capacity memory such as a tape or disk drive memory.

The memory device 10 and volatile memory 326 may store various types of software, such as an operating system or office productivity suite including a word processing application, a spreadsheet application, an email application, and/or a database application.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
    a memory device comprising:
        a plurality of data locations;
        a quantizing circuit having an analog-to-digital converter coupled to the plurality of data locations and a digital filter coupled to the analog-to-digital converter, wherein the digital filter comprises a counter configured to monitor a bit-stream from the analog-to digital converter to generate a count that corresponds with a value stored by a data location of the plurality of data locations; and
        an encoder configured to receive data to be stored in at least one of the plurality of data locations, generate redundant data based on the data, and associate the redundant data with the data such that the data and the redundant data are stored in the at least one of the plurality of data locations.

2. The system of claim 1, wherein each of the plurality of data locations comprise a floating gate transistor or a resistive memory element.

3. The system of claim 1, wherein the analog-to-digital converter comprises a delta-sigma modulator.

4. The system of claim 1, wherein the digital filter comprises a low-pass digital filter.

5. The system of claim 1, wherein the encoder is configured to generate the redundant data by calculating a parity bit.

6. The system of claim 1, wherein the encoder is configured to associate the redundant data with the data by forming an encoded data word with digits assigned to the redundant data and digits assigned to the data.

7. The system of claim 1, wherein the encoder is configured to associate the redundant data with the data by storing the redundant data and the data in corresponding data locations.

8. The system of claim 1, comprising a decoder configured to detect an error in stored data by determining whether the stored data is consistent with the redundant data with which the stored data is associated.

9. The system of claim 8, wherein the decoder is configured to correct an error in the stored data based on the redundant data with which the stored data is associated.

10. A method comprising:
reading encoded data from one or more data locations with a delta-sigma modulator comprising a comparator coupled to the one or more data locations and a digital filter coupled to the delta-sigma modulator, wherein the digital filter comprises a counter configured to monitor a bit-stream from the delta-sigma modulator to generate a count that corresponds with a value stored by a data location of the one or more data locations;
determining whether the encoded data read from the one or more data locations contains an error by decoding the encoded data read from the one or more data locations, wherein decoding the encoded data read from the one or more data locations comprises:
identifying, via a decoder configured to receive the encoded data from the one or more data locations, read redundant data and read non-redundant data in the encoded data read from the one or more data locations based on an association rule; and
determining, via the decoder, whether the read redundant data is consistent with the read non-redundant data.

11. The method of claim 10, wherein each of the one or more data locations is a single data location configured to store multiple bits.

12. The method of claim 10, wherein the one or more data locations each comprise flash memory or phase change memory.

13. The method of claim 10, further comprising repeatedly adjusting a property of the one or more data locations by at least one increment and measuring the one or more data locations with the delta-sigma modulator to write encoded data.

14. The method of claim 10, wherein determining whether the read redundant data is consistent with the read non-redundant data comprises:
applying the read non-redundant data to an encoding rule to produce hypothetical redundant data; and
outputting an error signal if the hypothetical redundant data is different from the read redundant data.

15. The method of claim 10, comprising correcting an error in the data read from the one or more data locations.

16. The method of claim 10, comprising adjusting a parameter of the delta-sigma modulator if the encoded data read from the one or more data locations is determined to have an error.

17. The method of claim 16, wherein adjusting the parameter of the delta-sigma modulator comprises increasing a sensing time of the delta-sigma modulator.

18. The method of claim 10, comprising:
generating redundant data by applying an encoding rule;
associating the redundant data with the data according to the association rule, wherein the encoded data comprises the data and the associated redundant data; and
writing the encoded data a single data location, wherein the written encoded data comprises both data and redundant data.

19. A method comprising:
encoding data using a Hamming code;
reading the encoded data from one or more data locations with a delta-sigma modulator comprising a current divider and a digital filter coupled to the delta-sigma modulator, wherein the digital filter comprises a counter configured to monitor a bit-stream from the delta-sigma modulator to generate a count that corresponds with a value stored by a data location of the one or more data locations;
determining whether the encoded data read from the one or more data locations contains an error by decoding the encoded data read from the one or more data locations via a decoder configured to receive the encoded data from the one or more data locations.

20. The method of claim 19, wherein encoding the data comprises encoding the data using a 7-4 Hamming code.

21. The method of claim 19, wherein encoding the data comprises encoding the data using an 8-4 Hamming code.

22. The system of claim 1, wherein the memory device is configured to store the data and the redundant data in a common data location as the at least one of the plurality of data locations.

23. The system of claim 1, wherein the memory device is configured to store the data and the redundant data in a distinct data locations as the at least one of the plurality of data locations.

* * * * *